(12) United States Patent
Hamann et al.

(10) Patent No.: US 8,020,390 B2
(45) Date of Patent: Sep. 20, 2011

(54) COOLING INFRASTRUCTURE LEVERAGING A COMBINATION OF FREE AND SOLAR COOLING

(75) Inventors: Hendrik F. Hamann, Yorktown Heights, NY (US); Madhusudan K. Iyengar, Poughkeepsie, NY (US); Theodore G. van Kessel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 152 days.

(21) Appl. No.: 12/479,798

(22) Filed: Jun. 6, 2009

(65) Prior Publication Data

US 2010/0307171 A1   Dec. 9, 2010

(51) Int. Cl.
*F25B 1/00* (2006.01)

(52) U.S. Cl. .......................................... 62/115; 62/235.1

(58) Field of Classification Search ................ 62/235.1, 62/236, 259.2, 371, 115; 165/48.2, 121, 165/900
See application file for complete search history.

(56) References Cited

U.S. PATENT DOCUMENTS

| | | | |
|---|---|---|---|
| 4,030,312 A * | 6/1977 | Wallin et al. | 62/235.1 |
| 4,070,870 A * | 1/1978 | Bahel et al. | 62/235.1 |
| 4,100,755 A * | 7/1978 | Leonard | 62/104 |
| 4,173,994 A * | 11/1979 | Hiser | 165/48.2 |
| 4,210,957 A * | 7/1980 | Spethmann | 700/276 |
| 4,222,244 A * | 9/1980 | Meckler | 62/235.1 |
| 4,285,211 A * | 8/1981 | Clark | 62/335 |
| 4,313,310 A | 2/1982 | Kobayashi et al. | |
| 4,327,555 A | 5/1982 | Dimon | |
| 4,429,545 A * | 2/1984 | Steinberg | 62/235.1 |
| 4,438,633 A * | 3/1984 | Hiser | 62/116 |
| 4,464,908 A * | 8/1984 | Landerman et al. | 62/235.1 |
| 4,738,305 A * | 4/1988 | Bacchus | 165/48.2 |
| 4,742,682 A * | 5/1988 | Assaf et al. | 60/641.1 |
| 4,910,971 A * | 3/1990 | McNab | 62/310 |
| 4,932,221 A * | 6/1990 | Shimizu et al. | 62/180 |
| 5,600,960 A * | 2/1997 | Schwedler et al. | 62/99 |
| 5,751,599 A * | 5/1998 | Bortnik et al. | 700/274 |
| 6,000,211 A * | 12/1999 | Bellac et al. | 60/775 |
| 6,313,990 B1 * | 11/2001 | Cheon | 361/699 |
| 6,446,448 B1 * | 9/2002 | Wang et al. | 62/183 |
| 6,687,122 B2 * | 2/2004 | Monfarad | 361/679.54 |
| 6,741,469 B1 * | 5/2004 | Monfarad | 361/700 |
| 6,938,433 B2 * | 9/2005 | Bash et al. | 62/229 |
| 6,941,759 B2 * | 9/2005 | Bellac et al. | 60/772 |
| 7,197,433 B2 | 3/2007 | Patel et al. | |
| 7,278,273 B1 | 10/2007 | Whitted et al. | |
| 7,340,912 B1 * | 3/2008 | Yoho et al. | 62/305 |
| 7,365,973 B2 | 4/2008 | Rasmussen et al. | 361/694 |
| 7,447,920 B2 * | 11/2008 | Sharma et al. | 713/300 |
| 7,672,128 B2 * | 3/2010 | Noteboom et al. | 361/696 |
| 7,808,780 B2 * | 10/2010 | Brunschwiler et al. | 361/679.53 |

(Continued)

*Primary Examiner* — Mohammad Ali
(74) *Attorney, Agent, or Firm* — Vazken Alexanian; Michael J. Chang, LLC

(57) ABSTRACT

Energy-efficient data center cooling techniques that utilize free cooling and/or solar cooling are provided. In one aspect, a cooling system is provided including a cooling tower; one or more modular refrigeration chiller units; and a water loop that can be selectively directed through the cooling tower, through one or more of the modular refrigeration chiller units or through a combination thereof. Another cooling system is provided including a solar cooling unit; one or more modular refrigeration chiller units; and a water loop that can be selectively directed through the solar cooling unit, through one or more of the modular refrigeration chiller units or through a combination thereof.

23 Claims, 24 Drawing Sheets

U.S. PATENT DOCUMENTS

| | | |
|---|---|---|
| 2002/0053214 A1* | 5/2002 | Melendez-Gonzalez et al. ............................ 62/235.1 |
| 2005/0103032 A1* | 5/2005 | Pierson ........................... 62/175 |
| 2007/0012041 A1* | 1/2007 | Goldman ..................... 60/641.8 |
| 2007/0209782 A1 | 9/2007 | Wyatt et al. |
| 2008/0041566 A1* | 2/2008 | Scott ........................ 165/104.33 |
| 2008/0060372 A1 | 3/2008 | Hillis et al. |
| 2008/0307806 A1 | 12/2008 | Campbell et al. |

* cited by examiner

FREE COOLING
200

SOLAR COOLING
400

SOLAR COOLING
500

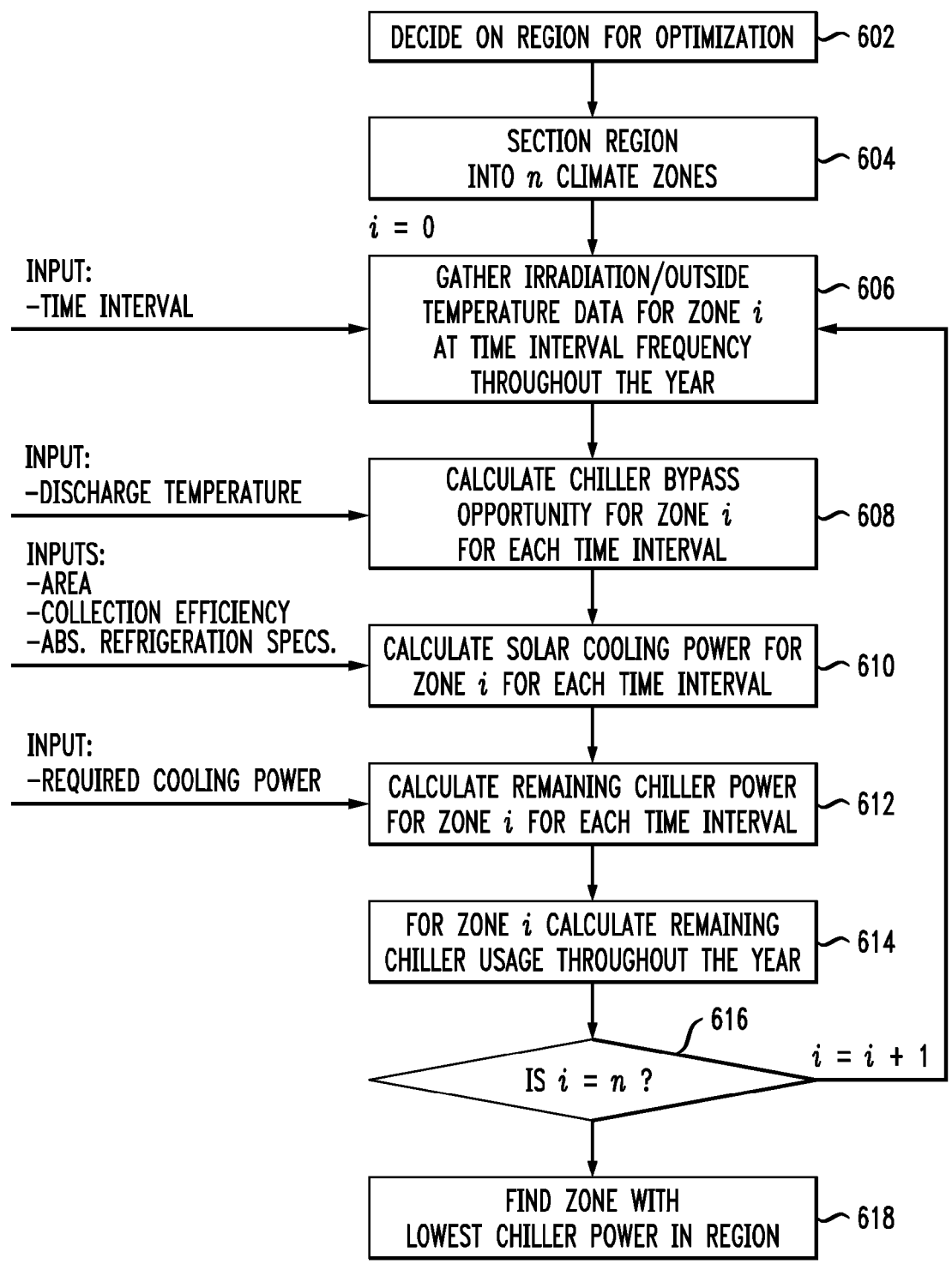

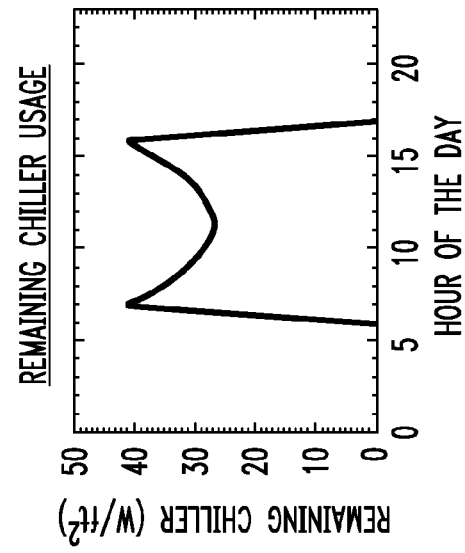
FIG. 7B
FIG. 7A
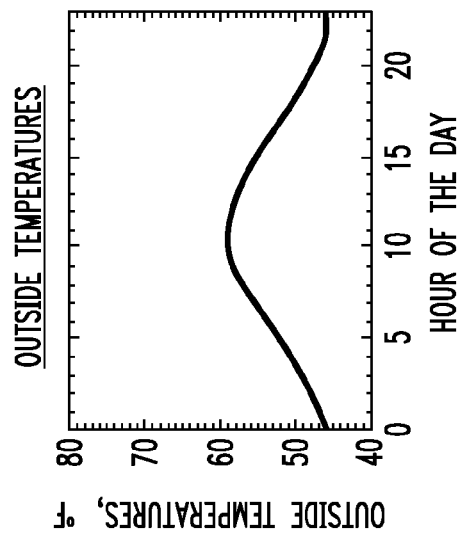
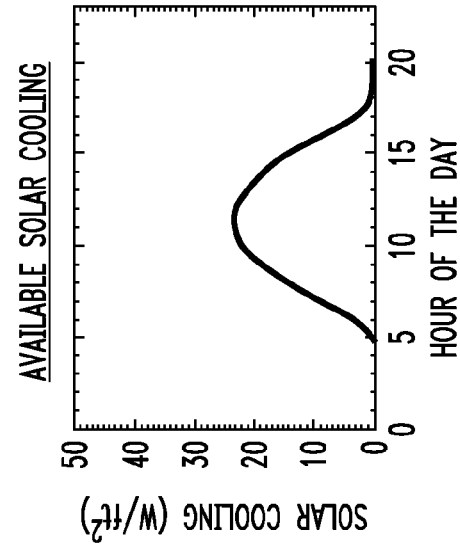
FIG. 7D
FIG. 7C

800

- COOL
----- WARM $T_{ret} = 70F$ 804
806 CHILLER POWER (COP~4.5)
808 BLOWER POWER (COP~8)
810
812
$T_{chw} = 44F$
802
$T_{dis} = 56F$

900

LOCATION x AVERAGE TEMPS

TODAY's SETPOINT

1200

1300

COOLING INFRASTRUCTURE LEVERAGING A COMBINATION OF FREE AND SOLAR COOLING

FIELD OF THE INVENTION

The present invention relates to data center cooling, and more particularly, to energy-efficient data center cooling techniques that utilize free cooling and/or solar cooling, when available.

BACKGROUND OF THE INVENTION

Computer equipment is continually evolving to operate at higher power levels. Increasing power levels pose challenges with regard to heat management. For example, many data centers now employ individual racks of blade servers that can develop 20,000 watts, or more, worth of thermal load. To accommodate the greater thermal loads resulting from higher power levels, conventional data center cooling systems inevitably must also operate at higher power levels in order to provide the amount of necessary cooling. As a result, the overall energy budget for the data center (including, for example, power for information technology (IT) equipment and data center infrastructure, such as lights, coupled with the power for the cooling system) can increase exponentially.

With a steady rise in energy costs, much research effort is directed to coming up with more energy-efficient alternatives. Some recent efforts have focused on improving data center cooling efficiency. For example, data centers commonly employ a raised floor cooling system, wherein space between a raised floor and a sub-floor, i.e., a sub-floor plenum, serves as a conduit to transport cooled air from air conditioning units (ACUs) to IT equipment racks in the data center. Techniques have been proposed for more efficiently arranging the IT racks to maximize the effect of available cooling.

Other more energy-efficient alternatives, however, would be greatly desirable, especially as cooling requirements continue to increase and currently available capabilities are exceeded.

SUMMARY OF THE INVENTION

The present invention provides energy-efficient data center cooling techniques that utilize free cooling and/or solar cooling. In one aspect of the invention, a cooling system is provided. The cooling system includes a cooling tower; one or more modular refrigeration chiller units; and a water loop that can be selectively directed through the cooling tower, through one or more of the modular refrigeration chiller units or through a combination thereof.

In another aspect of the invention, a method of cooling a data center is provided. The method includes the following steps. A cooling system is provided having a cooling tower, one or more modular refrigeration chiller units, and a water loop that can be selectively directed through the cooling tower, through one or more of the modular refrigeration chiller units or through a combination thereof, wherein the water loop is configured to, at an interface with the data center, receive a heat load from the data center, and to deliver chilled water back to the interface with the data center. An ambient air temperature is compared to a desired data center temperature. The water loop is selectively directed through the cooling tower or through a combination of the cooling tower and one or more of the modular refrigeration chiller units if the ambient air temperature is less than a desired data center temperature, otherwise the step of comparing the ambient air temperature to the desired data center temperature is repeated at a given time interval if the ambient air temperature is greater than a desired data center temperature.

In yet another aspect of the invention another cooling system is provided. The cooling system includes a solar cooling unit; one or more modular refrigeration chiller units; and a water loop that can be selectively directed through the solar cooling unit, through one or more of the modular refrigeration chiller units or through a combination thereof.

In still yet another aspect of the invention, another method of cooling a data center is provided. The method includes the following steps. A cooling system is provided having a solar cooling unit, one or more modular refrigeration chiller units, and a water loop that can be selectively directed through the solar cooling unit, through one or more of the modular refrigeration chiller units or through a combination thereof, wherein the water loop is configured to, at an interface with the data center, receive a heat load from the data center, and to deliver chilled water back to the interface with the data center. Available sunlight energy is compared to a minimum amount of sunlight energy needed for solar cooling. The water loop is selectively directed through the solar cooling unit or through a combination of the solar cooling unit and one or more of the modular refrigeration chiller units if the available sunlight energy is greater than the minimum amount of sunlight energy needed for solar cooling, otherwise the step of comparing the available sunlight energy to the minimum amount of sunlight energy needed for solar cooling is repeated at a given time interval if the available sunlight energy is less than the minimum amount of sunlight energy needed for solar cooling.

In a further aspect of the invention, a method for optimizing location of a data center is provided. The method includes the following steps. A particular region for locating the data center is defined. The region is sectioned into a plurality of climate zones. One or more of temperature and sun irradiation data are gathered for a given one of the climate zones at a particular time interval frequency throughout the year. One or more of an amount of free cooling and an amount of solar cooling available for each of the time intervals associated with the given climate zone are determined. A remaining amount of cooling needed above what can be provided by one or more of the free and the solar cooling for each of the time intervals associated with the given climate zone is determined. The remaining amount of cooling needed above what can be provided by one or more of the free and the solar cooling for the given climate zone for one year is determined. The remaining amount of cooling needed above what can be provided by one or more of the free and the solar cooling is compared for each climate zone within the region to identify an optimum location for the data center.

A more complete understanding of the present invention, as well as further features and advantages of the present invention, will be obtained by reference to the following detailed description and drawings.

BRIEF DESCRIPTION OF THE DRAWINGS

FIG. 6 is a diagram illustrating an exemplary methodology for optimizing location of a data center according to an embodiment of the present invention;

FIGS. 7A-D are graphs depicting an exemplary methodology for optimizing location of a data center being carried out for one climate zone according to an embodiment of the present invention;

DETAILED DESCRIPTION OF PREFERRED EMBODIMENTS

Figure 1:
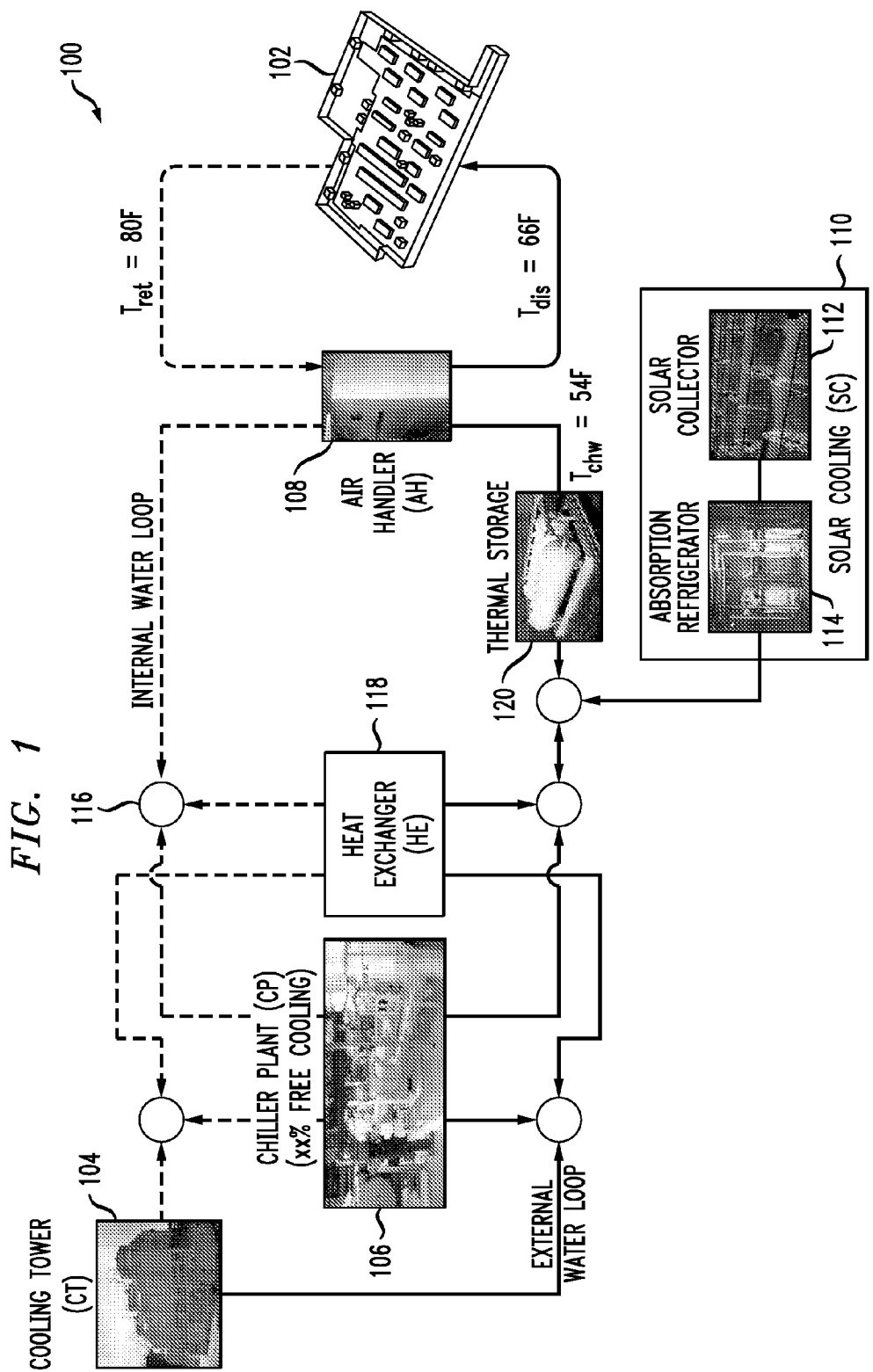
FIG. 1 is a diagram illustrating an exemplary data center cooling infrastructure according to an embodiment of the present invention.

Provided herein are techniques that can be used to minimize cooling energy costs of buildings having a centralized cooling infrastructure, such as a data center. FIG. 1 is a diagram illustrating exemplary data center cooling infrastructure 100. Cooling infrastructure 100 comprises cooling tower (CT) 104, central chiller plant (CP) 106 and air handlers (AH) 108, all of which control the temperature inside of data center 102. Cooling infrastructure 100 utilizes two water loops, an external water loop to connect chiller plant 106 with cooling tower 104, and an internal water loop to connect chiller plant 106 with air handlers 108. Cooling infrastructure 100 also comprises solar cooling (SC) unit 110 (having solar collector system 112 and absorption refrigerator 114) and bypass (BP) valves 116 able to bypass chiller plant 106 and provide cooling to the internal water loop via heat exchanger (HE) 118.

In FIG. 1, warm air (i.e., into air handlers 108 from data center 102)/warm water flow (i.e., through cooling infrastructure 100) is indicated by dashed lines and cooled air (i.e., from air handlers 108 into data center 102)/cool water flow (i.e., through cooling infrastructure 100) is indicated by solid lines. According to the present techniques, data center 102 takes advantage of free cooling when the outside temperature drops below a certain value. For illustrative purposes only, as shown in FIG. 1, a desired discharge temperature ($T_{dis}$) of 66 degrees Fahrenheit (° F.) is chosen. Chilled water having a temperature ($T_{chw}$) of about 54° F. is supplied to air handlers 108 to achieve the $T_{dis}$ of 66° F. With a two ° F. temperature drop in heat exchanger 118, chiller plant 106 can be bypassed (taking advantage of "free" cooling by way of cooling tower 104) if the outside temperature drops below 52° F. Return temperatures ($T_{ret}$) of about 80° F. can be experienced after data center 102 is cooled.

Thus, it is evident that free cooling can be readily maximized if a larger $T_{dis}$ is chosen. A larger $T_{dis}$ however requires that the data center is well managed thermally, avoiding hotspots and overprovisioning problems as discussed, for example, in U.S. application Ser. No. 11/750,325, filed by Claassen et al., entitled "Techniques for Analyzing Data Center Energy Utilization Practices," (which describes the use, e.g., of mobile measurement technology (MMT)), the contents of which are incorporated by reference herein. In addition, it is preferable to locate the data center in an area where free cooling can be maximized (see below).

In addition to free cooling, cooling infrastructure 100 also takes advantage of solar cooling. Namely, in solar cooling unit 110, heat is generated by solar collector system 112. The heat drives absorption refrigerator 114 which provides cooled water to the internal water loop. The amount of cooling provided by absorption refrigerator 114 depends on various parameters, but mostly on incident irradiation of solar collector system 112. In some cases, thermal storage units 120 are desired to be able to store some of the cooling energy.

The general idea of cooling infrastructure 100 is as follows, solar cooling will be generally most effective when free cooling is not available and free cooling is most effective when solar cooling is not available. This is because solar cooling is available during the day when the ambient temperatures are relatively higher, and free cooling can exploit the cooler temperatures during the night when solar cooling is not available. However, in some regions, both solar cooling and free cooling could be used during the daytime. Thus, the combination of solar cooling and free cooling provides a unique system for minimizing use of chiller plant 106 thereby saving power consumption of cooling infrastructure 100. In addition, cooling infrastructure 100 comprises water flow and thermal sensors and photodetectors (not shown) to automatically control valves 116 for bypassing chiller plant 106 and/or feeding cooled water from solar cooling unit 110 to the internal water loop (see below).

Figure 2:
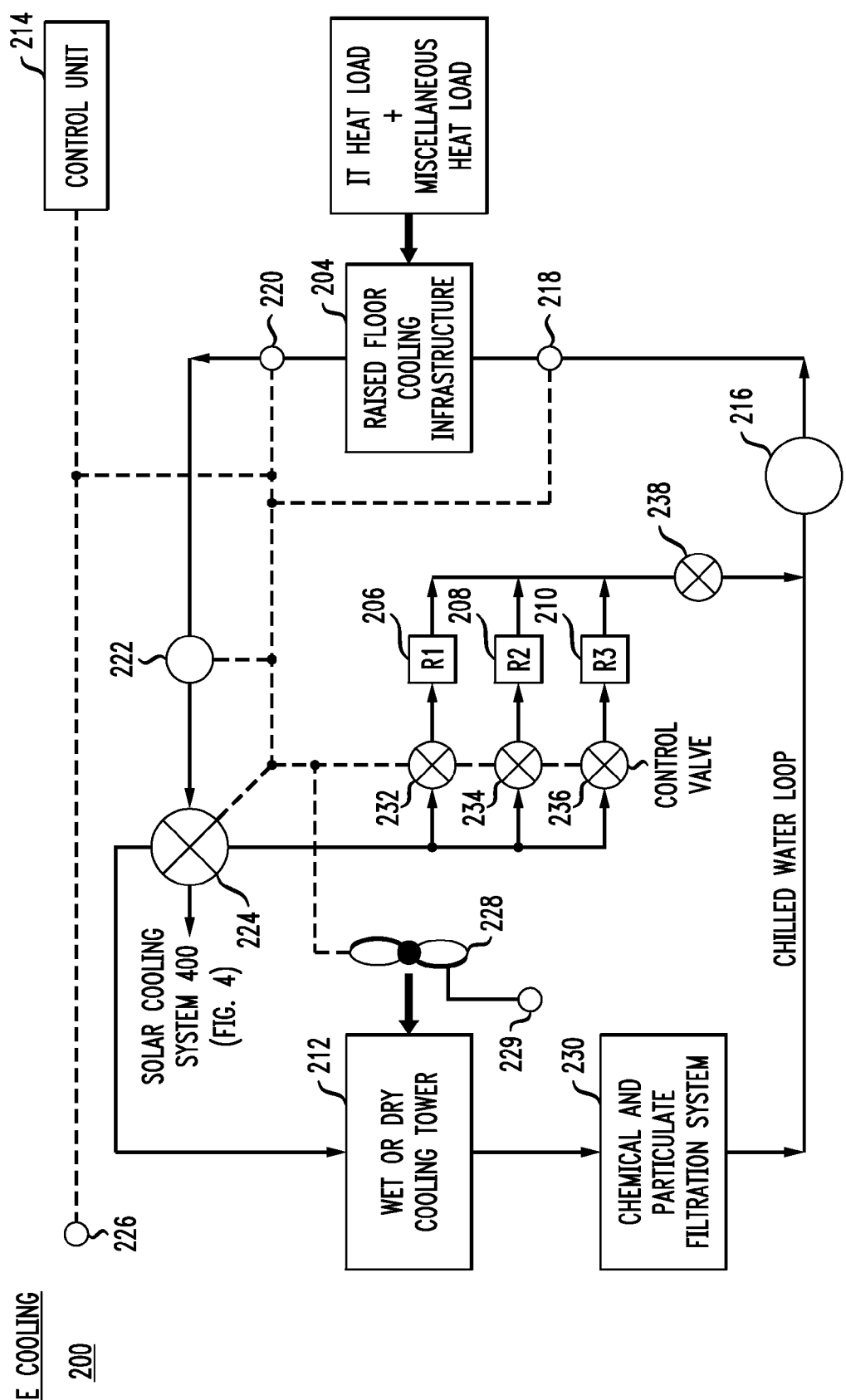
FIG. 2 is a diagram illustrating an exemplary free cooling system according to an embodiment of the present invention.

FIG. 2 is a diagram illustrating exemplary free cooling system 200. Free cooling system 200 comprises data center cooling infrastructure 204 that receives a heat load from information technology (IT) components, such as servers, and various other heat sources in a data center, and by way of a water loop through modular refrigeration chiller units 206, 208 and 210 (labeled "R1," "R2" and "R3," respectively) and/or cooling tower 212 that utilizes free cooling (as controlled by control unit 214), cools the data center. Data center cooling infrastructure 204 typically comprises a raised floor configuration, wherein cooled air is delivered to the data center through one or more perforated floor tiles by way of a sub-floor plenum(s). Namely, space between the raised floor and a sub-floor defines the sub-floor plenum. The sub-floor plenum serves as a conduit to transport the cooled air to IT component racks in the data center.

The water loop, and direction of flow thereof, through free cooling system 200 is represented by arrows. Connections between control unit 214 and various control valves, sensors and fan(s) (described below) in free cooling system 200 are represented by dashed lines. Data center cooling infrastructure 204, a raised floor cooling infrastructure, interfaces with the water loop through free cooling system 200 by way of one or more air conditioning units (ACUs) (not shown) that receive chilled water from the water loop. Each ACU typically comprises a blower motor to circulate air through the ACU and to blow cooled air, e.g., into the sub-floor plenum. As such, in most data centers, the ACUs are simple heat exchangers mainly consuming power needed to blow the cooled air into the sub-floor plenum. Air returns to the ACUs bring warm air back to this interface with the water loop permitting heat transfer to the water loop and subsequent cooling by free cooling system 200. The ACUs and raised floor, i.e., sub-floor plenum(s) and perforated floor tiles, are all part of an air handling system of the data center.

The ACUs then discharge warmed water back through the water loop. When free cooling is available, for example, at night when temperatures are typically lower (and solar cooling is not available), the warmed water from data center cooling infrastructure 204 enters the water loop and is directed by way of three way valve 224 (under direction of control unit 214) towards cooling tower 212. Control unit 214 monitors several important parameters in order to make the determination whether to selectively direct the water loop through cooling tower 212 (free cooling), or alternatively through the modular refrigeration chiller units (see below). Namely, by way of water temperature sensor 220, water flow sensor 222 and air temperature and relative humidity sensor 226, control unit 214 determines whether free cooling is available. Namely, by comparing readings from water temperature sensor 220 (which measures water temperatures exiting data center cooling infrastructure 204) and air temperature and relative humidity sensor 226 (which measures air temperatures and relative humidity of the ambient air), control unit 214 can determine whether the ambient air temperature/relative humidity is sufficiently low enough to cool the water (through cooling tower 212) to a desired temperature. According to an exemplary embodiment, control unit 214 is present in the form of an apparatus such as apparatus 1400 of FIG. 14 (described below) configured to perform one or more of the functions associated with the control unit, as described herein.

In some instances, it may be possible to use free cooling to supplement cooling by the modular refrigeration chiller units. In that instance, control unit 214, by way of three way valve 224 will selectively direct a portion of the water loop through cooling tower 212, and a portion of the water loop through the modular refrigeration chiller units. The amount of water that is directed to each path can be monitored by control unit 214 by way of water flow sensor 222. For example, if the ambient temperature/relative humidity can support only a certain amount of free cooling, and if water flow sensor 222 detects an increased water flow, then control unit 214 by way of three way valve 224 can increase the amount of water directed through the modular refrigeration chiller units.

It is also possible to combine free cooling with solar cooling. For example, solar cooling can be used during the day (or part of it) and free cooling can be used during the night (or part of it). According to an exemplary embodiment, free cooling system 200 can direct the water loop (or a portion thereof), by way of three way valve 224, through cooling tower 212 during the nighttime when outside temperatures are low. During the daytime, when solar cooling is available and outside temperatures are high, the water loop (or a portion thereof) can be directed, by way of three way valve 224, through a solar cooling unit. An exemplary solar cooling system comprising a solar cooling unit is shown illustrated in FIG. 4, described below.

Water that is directed through cooling tower 212 (a dry cooling tower—where the water being cooled does not come in direct contact with the air that is being blown through the tower, or a wet cooling tower—where the water comes in contact with the air which uses water evaporation to make use of latent heat of vaporization of water to help heat transfer, but the water is exposed to contaminants in the air) is cooled by heat in the water being transferred to the ambient air, which is driven by fan 228. Fan 228 is controlled by control unit 214. Namely, control unit 214 can regulate when fan 228 is turned on/off and/or at what speed fan 228 is operated. Thus, for example, when free cooling is not available control unit 214 can turn fan 228 off to conserve power. Air flow sensor 229 provides air flow rate data from the cooling tower to control unit 214. After exiting cooling tower 212, the water passes through chemical and particulate filtration system 230 which insures the quality of the water that will re-enter data center cooling infrastructure 204.

Water that is directed towards the modular refrigeration chiller units can pass through a single modular refrigeration chiller unit or a combination of the modular refrigeration chiller units depending on need. The particular path(s) chosen is again under control of control unit 214. Namely, control unit 214 controls valves 232, 234 and 236 which regulate water flow through modular refrigeration chiller units 206, 208 and 210, respectively. Thus, control unit 214 can utilize only those modular refrigeration chiller units needed for cooling at a given time. The modular refrigeration chiller units not being used can be turned off to conserve power. Alternatively, control unit 214 can control a compressor speed of the modular refrigeration chiller units to speed them up or slow them down either on an individual or multi-unit basis, so as to control the power being consumed while also controlling the cooling.

Chilled water exiting cooling tower 212 and/or the modular refrigeration chiller unit(s) is then circulated back through data center cooling infrastructure 204 by pump 216. One way valve 238 prevents chilled water from undesirably flowing back through the modular refrigeration chiller units. Water temperature sensor 218 measures the temperature of the chilled water that is pumped back into data center cooling infrastructure 204.

Figure 3:
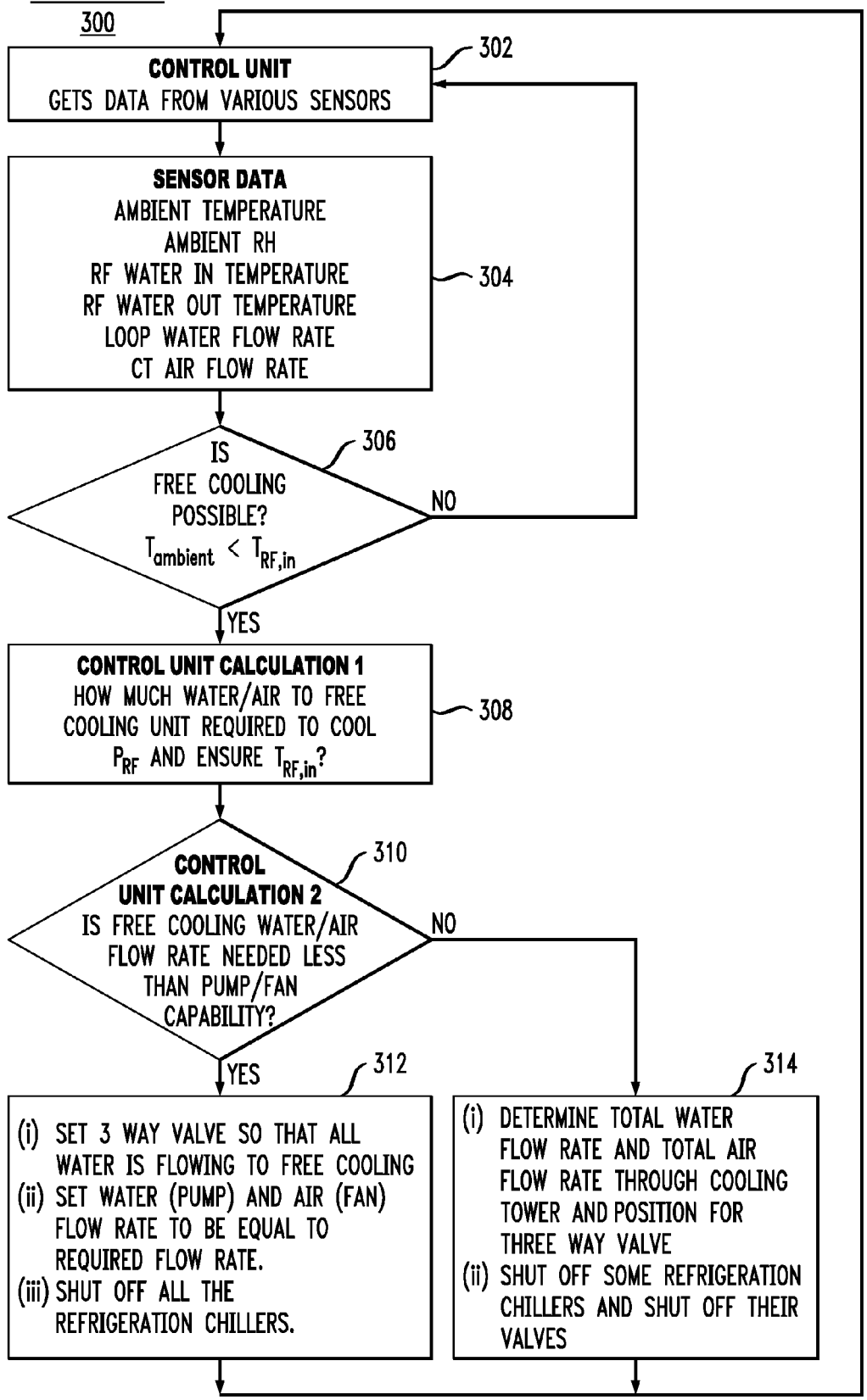
FIG. 3 is a diagram illustrating an exemplary methodology for free cooling according to an embodiment of the present invention.

FIG. 3 is a diagram illustrating exemplary methodology 300 for free cooling, e.g., using a free cooling system, such as free cooling system 200, described in conjunction with the description of FIG. 2, above. In step 302, a control unit (e.g., control unit 214 of FIG. 2, described above) obtains data from one or more of a variety of sensors (e.g., water temperature sensors 218/220, water flow sensor 222, air temperature and relative humidity sensor 226 and air flow sensor 229 of FIG. 2). In step 304, data from the sensors is compiled, e.g., by the control unit. By way of example only, the air temperature and relative humidity sensor can provide ambient air temperature and relative humidity (RH) data, the water temperature sensors can provide data on water temperatures going into and coming out from the data center cooling infrastructure (e.g., a raised floor (RF) cooling structure (see above)), the water flow sensor can provide water loop flow rate data and the air flow sensor can provide air flow rate data from the cooling tower (CT).

In step 306, a determination is made (for example by the control unit) as to whether any amount of free cooling is available. Namely, the ambient air temperature ($T_{ambient}$) is compared to a desired data center temperature and a determination is made as to whether the ambient air temperature ($T_{ambient}$) is less than a desired data center temperature, e.g., measured as the discharge temperatures of the air handling system in the data center ($T_{RF,in}$). If $T_{ambient}$ is less than $T_{RF,in}$, then free cooling is available (then proceed to step 308, described below). However, If $T_{ambient}$ is greater than $T_{RF,in}$, then free cooling is not available. Then, at a certain time interval, steps 302, 304 and 306 are again performed to determine if free cooling has become possible.

In step 308, when free cooling is available, the water loop is then selectively directed (under control of the control unit) through the cooling tower (or through a combination of the cooling tower and one or more of the modular refrigeration chiller units). Namely, the control unit determines a water flow rate and an air flow rate through the cooling tower (i.e., how much water and air need to be provided to the cooling tower, by way of a three way valve (e.g., three way valve 224 of FIG. 2, described above) and a fan (e.g., fan 228 of FIG. 2, described above), respectively) required to cool raised floor power ($P_{RF}$) (i.e., raised floor power that is rejected into the water loop) and ensure $T_{RF,in}$. In step 310, the control unit compares the required water flow rate and air flow rate to water flow rate and air flow rate capabilities of the cooling system and determines whether a water and air flow rate needed for free cooling is less then what can be provided by the pump (e.g., pump 216 of FIG. 2) and the fan, respectively. If the water/air flow rate needed for free cooling is less than the water/air flow rate that can be provided by the pump and fan, then in step 312 the control unit 1) sets the three way valve to direct all water towards a free cooling tower (e.g., cooling tower 212 of FIG. 2), 2) sets the pump (water flow rate) and the fan (air flow rate) to be equal to the required water/air flow rate and 3) shuts off all modular refrigeration chiller units (e.g., modular refrigeration chiller units 206, 208 and 210 of FIG. 2). The steps of methodology 300 can be repeated at desired time intervals.

On the other hand, if the water/air flow rate needed for free cooling is greater than the water/air flow rate that can be provided by the pump and fan, then in step 314 the control unit directs only a portion of the water loop through the cooling tower, based on the capabilities of the free cooling system. Namely, the control unit 1) determines a total water/air flow rate based on the pump/fan capabilities and positions the three way valve to direct water through the free cooling tower at that water flow rate (and thereby directing the remainder of the water loop through the modular refrigeration chiller units) and 2) since a portion of the cooling is free cooling, turns off one or more of the modular refrigeration chiller units (and turns off their valves). The steps of methodology 300 can be repeated at desired time intervals.

As highlighted above, the control unit (i.e., control unit 214) may be embodied in an apparatus such as apparatus 1400 of FIG. 14 (described below) configured to perform one or more of the functions associated with the control unit. Thus, the apparatus of FIG. 14 may be configured to perform one or more of the steps of methodology 300.

Figure 4:
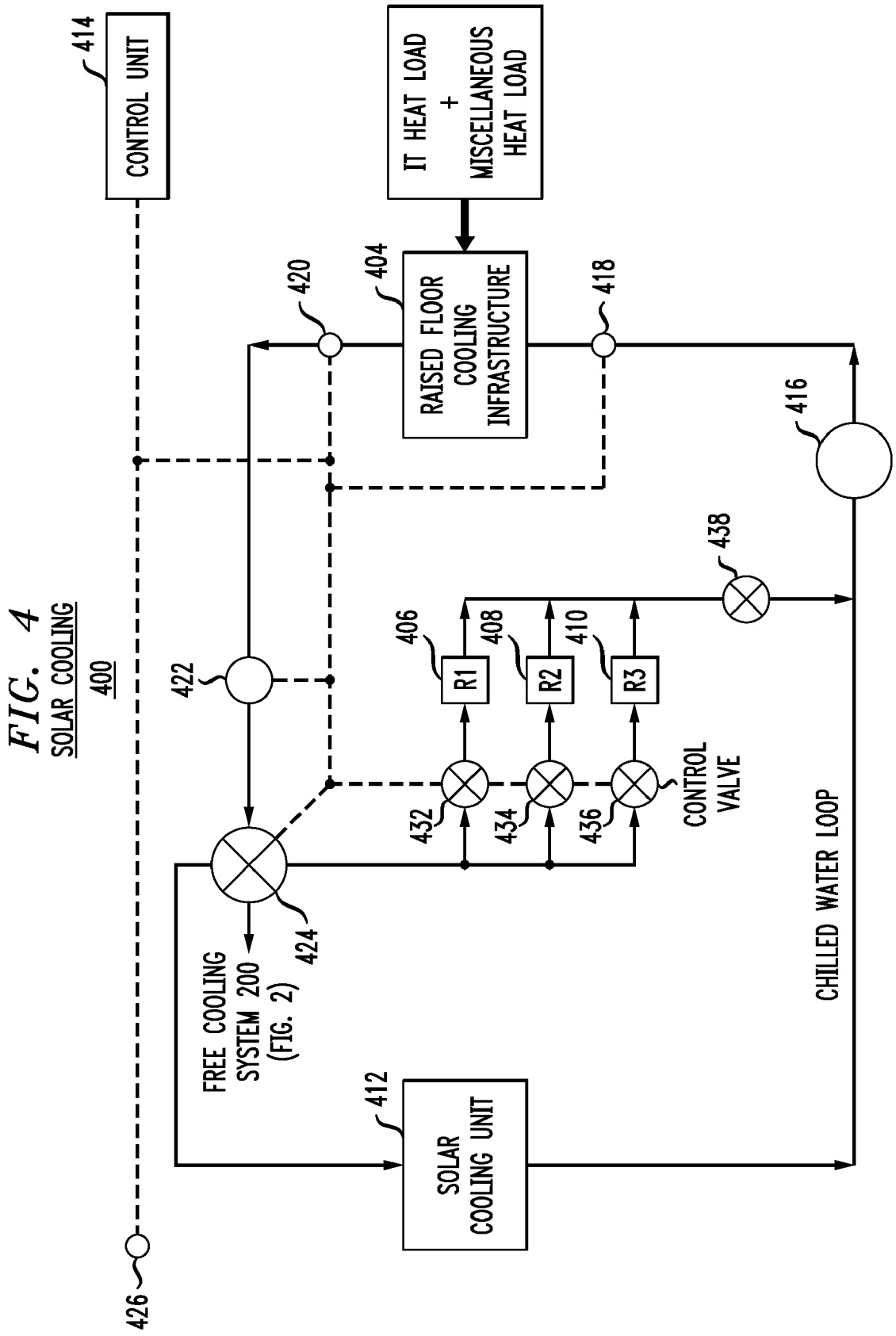
FIG. 4 is a diagram illustrating an exemplary solar cooling system according to an embodiment of the present invention.

FIG. 4 is a diagram illustrating exemplary solar cooling system 400. Solar cooling system 400 comprises data center cooling infrastructure 404 that receives a heat load from information technology (IT) components, such as servers, and various other heat sources in a data center, and by way of a water loop through modular refrigeration chiller units 406, 408 and 410 (labeled "R1," "R2" and "R3," respectively) and/or solar cooling unit 412 that utilizes solar cooling (as controlled by control unit 414), cools the data center. Data center cooling infrastructure 404 typically comprises a raised floor configuration, wherein cooled air is delivered to the data center through one or more perforated floor tiles by way of a sub-floor plenum(s).

The water loop, and direction of flow thereof, through solar cooling system 400 is represented by arrows. Connections between control unit 414 and various control valves and sensors (described below) in solar cooling system 400 are represented by dashed lines. Data center cooling infrastructure 404, a raised floor cooling infrastructure, interfaces with the water loop through solar cooling system 400 by way of one or more ACUs (not shown) that receive chilled water from the water loop. Each ACU typically comprises a blower motor to circulate air through the ACU and to blow cooled air, e.g., into the sub-floor plenum. As such, in most data centers, the ACUs are simple heat exchangers mainly consuming power needed to blow the cooled air into the sub-floor plenum. Air returns to the ACUs bring warm air back to this interface with the water loop permitting heat transfer to the water loop and subsequent cooling by solar cooling system 400. The ACUs and raised floor, i.e., sub-floor plenum(s) and perforated floor tiles, are all part of an air handling system of the data center.

The ACUs then discharge warmed water back through the water loop. When solar cooling is available, for example, during the day, the warmed water from data center cooling infrastructure 404 enters the water loop and is directed by way of three way valve 424 (under direction of control unit 414) towards solar cooling unit 412. Control unit 414 monitors several important parameters in order to make the determination whether to selectively direct the water loop through solar cooling unit 412 (solar cooling), or alternatively through the modular refrigeration chiller units (see below). Namely, by way of sunlight heat index sensor 426, control unit 414 determines whether solar cooling is available. Namely, by comparing readings from sunlight heat index sensor 426 (which measures available sunlight energy) and a minimum amount of sunlight energy needed for solar cooling, control unit 414 can determine whether solar cooling is available. According to an exemplary embodiment, control unit 414 is present in the form of an apparatus such as apparatus 1400 of FIG. 14 (described below) configured to perform one or more of the functions associated with the control unit, as described herein. Further, such an apparatus may serve as a common control unit for both system 200 and system 400.

In some instances, it may be possible to use solar cooling to supplement cooling by the modular refrigeration chiller units. In that instance, control unit 414, by way of three way valve 424 will selectively direct a portion of the water loop through solar cooling unit 412, and a portion of the water loop through the modular refrigeration chiller units. The amount of water that is directed to each path can be monitored by control unit 414 by way of water flow sensor 422. For example, if the available sunlight energy can support only a certain amount of solar cooling, and if water flow sensor 422 detects an increased water flow, then control unit 414 by way of three way valve 424 can increase the amount of water directed through the modular refrigeration chiller units.

It is also possible to combine solar cooling with free cooling. For example, solar cooling can be used during the day (or part of it) and free cooling can be used during the night (or part of it). According to an exemplary embodiment, solar cooling system 400 can direct the water loop (or a portion thereof), by way of three way valve 424, through solar cooling unit 412 during the day when solar cooling is available (and when outside temperatures are high). During the nighttime, when outside temperatures are low, the water loop (or a portion thereof) can be directed, by way of three way valve 424, through a cooling tower of a free cooling system, such as free cooling system 200 of FIG. 2. That way the combined systems can maximize the most energy-efficient cooling when available.

Water that is directed towards the modular refrigeration chiller units can pass through a single modular refrigeration chiller unit or a combination of the modular refrigeration chiller units depending on need. The particular path(s) chosen is again under control of control unit 414. Namely, control unit 414 controls valves 432, 434 and 436 which regulate water flow through modular refrigeration chiller units 406, 408 and 410, respectively. Thus, control unit 414 can utilize only those modular refrigeration chiller units needed for cooling at a given time. The modular refrigeration chiller units not being used can be turned off to conserve power. Alternatively, control unit 414 can control a compressor speed of the modular refrigeration chiller units to speed them up or slow them down either on an individual or multi-unit basis, so as to control the power being consumed while also controlling the cooling.

Chilled water exiting solar cooling unit 412 and/or the modular refrigeration chiller unit(s) is then circulated back through data center cooling infrastructure 404 by pump 416. One way valve 438 prevents chilled water from undesirably flowing back through the modular refrigeration chiller units. Water temperature sensor 418 measures the temperature of the chilled water that is pumped back into data center cooling infrastructure 404 and water temperature sensor 420 measures water temperatures exiting data center cooling infrastructure 404.

Solar cooling unit 412 is configured to convert solar (sunlight) energy into electrical energy for use in cooling, e.g., by way of an absorption refrigeration system in conjunction with one or more solar collectors. An absorption refrigeration loop utilizes heat as the input energy to drive the device and create refrigeration. The use of heat instead of mechanical work or electrical energy makes this device specifically amenable for use in the teachings presented herein, i.e., where solar irradiation can be used to drive an absorption refrigeration function.

Figure 5:
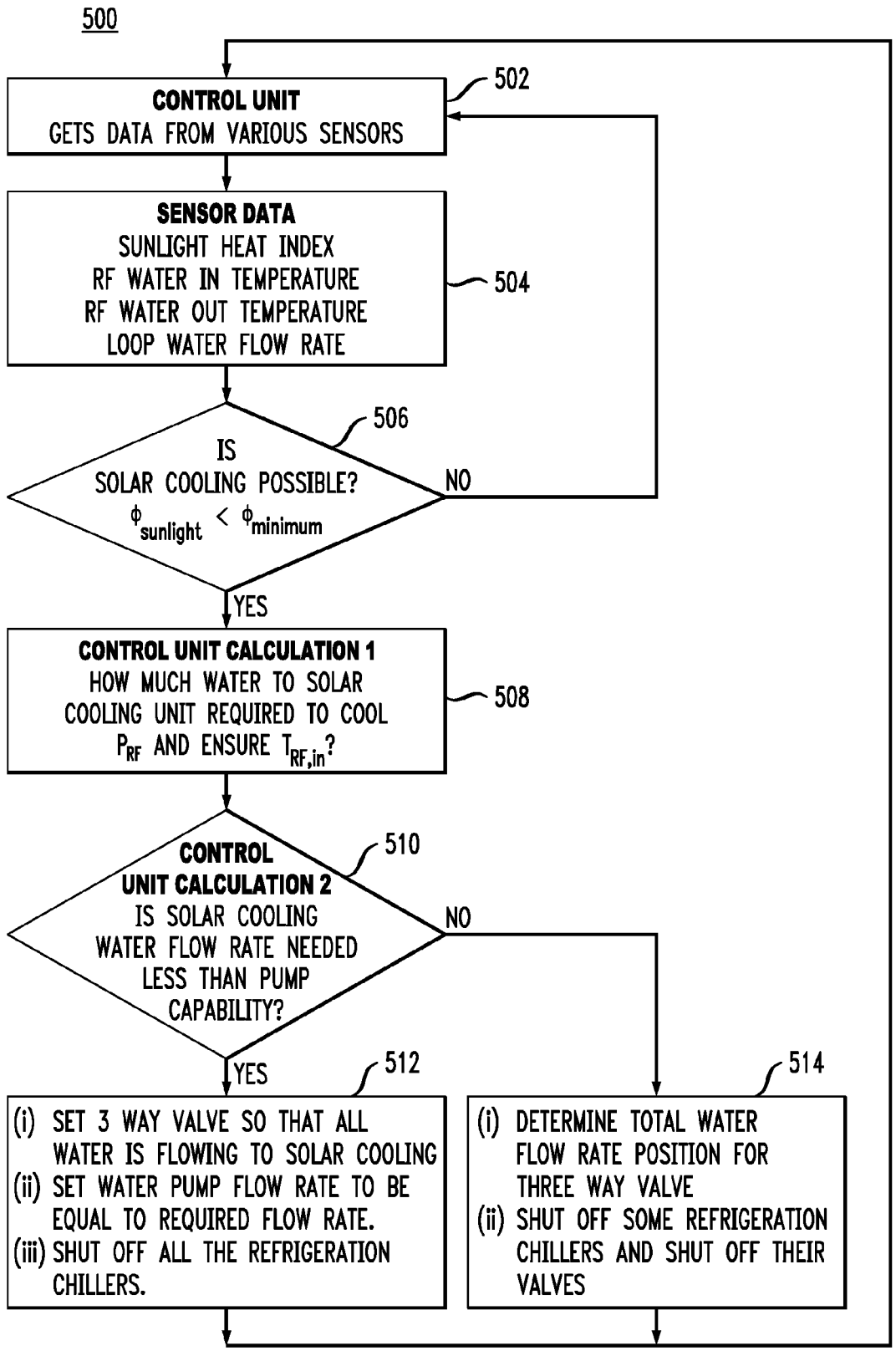
FIG. 5 is a diagram illustrating an exemplary methodology for solar cooling according to an embodiment of the present invention.

FIG. 5 is a diagram illustrating exemplary methodology 500 for solar cooling, e.g., using a solar cooling system, such as solar cooling system 400, described in conjunction with the description of FIG. 4, above. In step 502, a control unit (e.g., control unit 414 of FIG. 4, described above) obtains data from one or more of a variety of sensors (e.g., water temperature sensors 418/420, water flow sensor 422 and sunlight heat index sensor 426 of FIG. 4). In step 504, data from the sensors is compiled, e.g., by the control unit. By way of example only, the sunlight heat index sensor can provide sunlight heat index data, the water temperature sensors can provide data on water temperatures going into and coming out from the data center cooling infrastructure (e.g., a raised floor (RF) cooling structure (see above)) and the water flow sensor can provide water loop flow rate data.

In step 506, a determination is made (for example by the control unit) as to whether any amount of solar cooling is available. Namely, an amount of available sunlight energy ($\phi_{sunlight}$) is compared to a minimum amount of sunlight energy ($\phi_{minimum}$) needed for solar cooling and a determination is made as to whether the amount of available sunlight energy ($\phi_{sunlight}$) is greater than the minimum amount of sunlight energy ($\phi_{minimum}$) needed for solar cooling. If $\phi_{sunlight}$ is greater than $\phi_{minimum}$, then solar cooling is available (then proceed to step 508, described below). However, if $\phi_{sunlight}$ is less than $\phi_{minimum}$, then solar cooling is not available. Then, at a certain time interval, steps 502, 504 and 506 are again performed to determine if solar cooling has become possible.

In step 508, when solar cooling is available, the water loop is then selectively directed (under control of the control unit) through a solar cooling unit (e.g., solar cooling unit 412 of FIG. 4, described above) (or through a combination of the solar cooling unit and one or more of the modular refrigeration chiller units). Namely, the control unit determines a water flow rate through the solar cooling unit (i.e., how much water needs to be provided to the solar cooling unit, by way of the three way valve (e.g., three way valve 424 of FIG. 4, described above), required to cool raised floor power ($P_{RF}$) and ensure the required discharge temperatures of the air handling system in the data center $T_{RF,in}$. In step 510, the control unit compares the required water flow rate to water flow rate capabilities of the cooling system and determines whether a water flow rate needed for solar cooling is less than what can be provided by the pump (e.g., pump 416 of FIG. 4). If the water flow rate needed for solar cooling is less than the water flow rate that can be provided by the pump, then in step 512 the control unit 1) sets the three way valve to direct all water towards the solar cooling unit, 2) sets the pump (water flow rate) to be equal to the required water flow rate and 3) shuts off all of the modular refrigeration chiller units (e.g., modular refrigeration chiller units 406, 408 and 410 of FIG. 4). The step of methodology 500 can be repeated at desired time intervals.

On the other hand, if the water flow rate needed for solar cooling is greater than the water flow rate that can be provided by the pump, then in step 514 the control unit directs only a portion of the water loop through the solar cooling unit, based on the capabilities of the solar cooling system. Namely, the control unit 1) determines a total water flow rate based on the pump capabilities and positions the three way valve to direct water through the solar cooling unit at that water flow rate (and thereby directing the remainder of the water through the modular refrigeration chiller units) and 2) since a portion of the cooling is solar cooling, turns off one or more of the modular refrigeration chiller units (and turns off their valves). The steps of methodology 500 can be repeated at desired time intervals.

As highlighted above, the control unit (i.e., control unit 414) may be embodied in an apparatus such as apparatus 1400 of FIG. 14 (described below) configured to perform one or more of the functions associated with the control unit. Thus, the apparatus of FIG. 14 may be configured to perform one or more of the steps of methodology 500.

Given the above teachings, according to an exemplary embodiment, a cooling system includes a cooling tower, one or more modular refrigeration chiller units and a water loop that can be selectively directed through the cooling tower, through one or more of the modular refrigeration chiller units or through a combination thereof. The cooling system can further include a control unit configured to control direction of the water loop through the cooling tower, through one or more of the modular refrigeration chiller units or through a combination thereof. The cooling system can be a data center cooling system, wherein the water loop is configured to, at an interface with the data center, receive a heat load from the data center, and to deliver chilled water back to the interface with the data center. The interface with the data center can include one or more ACUs. The cooling tower can include a fan, connected to and controlled by the control unit, to drive heat transfer from the water loop to ambient air. The cooling system can further include a valve which under direction of the control unit is adapted to selectively direct at least a portion of the water loop through the cooling tower, through one or more of the modular refrigeration chiller units or through a combination thereof. Each of the modular refrigeration chiller units can have a valve associated therewith which under direction of the control unit is adapted to direct at least a portion of the water loop through the corresponding modular refrigeration chiller unit. The cooling system can further include a filtration system adapted to remove chemicals and particulates from the water loop. The cooling tower can be a wet cooling tower or a dry cooling tower.

The cooling system can further include a first water temperature sensor configured to measure water temperatures at a point in the water loop where the heat load from the data center is received and a second water temperature sensor configured to measure water temperatures at a point in the water loop where the chilled water is delivered back to the data center, wherein both the first water temperature sensor and the second water temperature sensor are connected to, and monitored by, the control unit. The cooling system can further include an air temperature and relative humidity sensor configured to measure air temperature and relative humidity of the ambient air connected to, and monitored by, the control unit, and a water flow sensor connected to, and monitored by, the control unit. The cooling system can further include a solar cooling unit through which the water loop can also be directed, wherein the water loop can be selectively directed through the cooling tower, through the solar cooling unit, through one or more of the modular refrigeration chiller units, through a combination of the cooling tower and one or more of the modular refrigeration chiller units or through a combination of the solar cooling unit and one or more of the modular refrigeration chiller units.

According to another exemplary embodiment, a method of cooling a data center includes providing a cooling system having a cooling tower, one or more modular refrigeration chiller units, and a water loop that can be selectively directed through the cooling tower, through one or more of the modular refrigeration chiller units or through a combination thereof (wherein the water loop is configured to, at an interface with the data center, receive a heat load from the data center, and to deliver chilled water back to the interface with the data center), comparing an ambient air temperature to a desired data center temperature and selectively directing the water loop through the cooling tower or through a combination of the cooling tower and one or more of the modular refrigeration chiller units if the ambient air temperature is less than a desired data center temperature, otherwise repeating the step of comparing the ambient air temperature to the desired data center temperature at a given time interval if the ambient air temperature is greater than a desired data center temperature. One or more of water temperature in the water loop, water flow rate through the water loop, air flow rate through the cooling tower, ambient air temperature and relative humidity can be obtained.

The directing step can further include determining a water flow rate and air flow rate through the cooling tower required to attain the desired data center temperature, comparing the required water flow rate and air flow rate to a water flow rate and an air flow rate the cooling system is capable of providing through the cooling tower, directing the entire water loop through the cooling tower, if the required water flow rate and air flow rate are less than the water flow rate and air flow rate capabilities of the cooling system and directing only a portion of the water loop through the cooling tower, if the required water flow rate and air flow rate are greater than the water flow rate and air flow rate capabilities of the cooling system. The step of directing the entire water loop towards the cooling tower can further include setting a water flow rate and air flow rate through the cooling tower equal to the water flow rate and air flow rate required to attain the desired data center temperature and turning off all of the modular refrigeration chiller units. The step of directing only a portion of the water loop towards the cooling tower can further include setting a water flow rate through the cooling tower equal to the water flow rate capabilities of the cooling system and directing a remainder of the water loop through the modular refrigeration chiller units.

The cooling system can further include a solar cooling unit through which the water loop can also be directed, and the method can further include comparing available sunlight energy to a minimum amount of sunlight energy needed for solar cooling and selectively directing the water loop through the solar cooling unit or through a combination of the solar cooling unit and one or more of the modular refrigeration chiller units if the available sunlight energy is greater than the minimum amount of sunlight energy needed for solar cooling, otherwise repeating the step of comparing the available sunlight energy to the minimum amount of sunlight energy needed for solar cooling at a given time interval if the available sunlight energy is less than the minimum amount of sunlight energy needed for solar cooling.

According to yet another exemplary embodiment, a cooling system includes a solar cooling unit, one or more modular refrigeration chiller units and a water loop that can be selectively directed through the solar cooling unit, through one or more of the modular refrigeration chiller units or through a combination thereof. The solar cooling unit can include an absorption refrigeration system and one or more solar collectors. The cooling system can further include a control unit configured to control direction of the water loop through the solar cooling unit, through one or more of the modular refrigeration chiller units or through a combination thereof.

The cooling system can be a data center cooling system, wherein the water loop is configured to, at an interface with the data center, receive a heat load from the data center, and to deliver chilled water back to the interface with the data center. The interface with the data center can include one or more ACUs. The cooling system can further include a valve which under direction of the control unit is adapted to selectively direct at least a portion of the water loop through the solar cooling unit, through one or more of the modular refrigeration chiller units or through a combination thereof. Each of the modular refrigeration chiller units can have a valve associated therewith which under direction of the control unit is adapted to direct at least a portion of the water loop through the corresponding modular refrigeration chiller unit.

The cooling system can further include a first water temperature sensor configured to measure water temperatures at a point in the water loop where the heat load from the data center is received and a second water temperature sensor configured to measure water temperatures at a point in the water loop where the chilled water is delivered back to the data center, wherein both the first water temperature sensor and the second water temperature sensor are connected to, and monitored by, the control unit. The cooling system can further include a sunlight heat index sensor connected to, and monitored by, the control unit, and a water flow sensor connected to, and monitored by, the control unit. The cooling system can further include a cooling tower through which the water loop can also be directed, wherein the water loop can be selectively directed through the solar cooling unit, through the cooling tower, through one or more of the modular refrigeration chiller units, through a combination of the solar cooling unit and one or more of the modular refrigeration chiller units or through a combination of the cooling tower and one or more of the modular refrigeration chiller units.

According to still yet another exemplary embodiment, a method of cooling a data center includes providing a cooling system having a solar cooling unit, one or more modular refrigeration chiller units, and a water loop that can be selectively directed through the solar cooling unit, through one or more of the modular refrigeration chiller units or through a combination thereof, wherein the water loop is configured to, at an interface with the data center, receive a heat load from the data center, and to deliver chilled water back to the interface with the data center, comparing available sunlight energy to a minimum amount of sunlight energy needed for solar cooling and selectively directing the water loop through the solar cooling unit or through a combination of the solar cooling unit and one or more of the modular refrigeration chiller units if the available sunlight energy is greater than the minimum amount of sunlight energy needed for solar cooling, otherwise repeating the step of comparing the available sunlight energy to the minimum amount of sunlight energy needed for solar cooling at a given time interval if the available sunlight energy is less than the minimum amount of sunlight energy needed for solar cooling. One or more of water temperatures in the water loop, water flow rate through the water loop, air flow rate through the cooling tower and available sunlight energy can be obtained. The directing step can further include determining a water flow rate through the solar cooling unit required to attain the desired data center temperature, comparing the required water flow rate to a water flow rate the cooling system is capable of providing through the solar cooling unit, directing the entire water loop through the solar cooling unit, if the required water flow rate is less than the water flow rate capabilities of the cooling system and directing only a portion of the water loop through the solar cooling unit, if the required water flow rate is greater than the water flow rate capabilities of the cooling system.

The step of directing the entire water loop through the solar cooling unit can further include setting a water flow rate through the solar cooling unit equal to the water flow rate required to attain the desired data center temperature and turning off all of the modular refrigeration chiller units. The step of directing only a portion of the water loop through the cooling tower can further include setting a water flow rate through the solar cooling unit equal to the water flow rate capabilities of the cooling system and directing a remainder of the water loop through the modular refrigeration chiller units. The method can further include turning off one or more of the modular refrigeration chiller units. The cooling system can further include a cooling tower through which the water loop can also be directed, and the method can further include comparing an ambient air temperature to a desired data center temperature and selectively directing the water loop through the cooling tower or through a combination of the cooling tower and one or more of the modular refrigeration chiller units, if the ambient air temperature is less than a desired data center temperature, otherwise repeating the step of comparing the ambient air temperature to the desired data center temperature at a given time interval if the ambient air temperature is greater than a desired data center temperature.

Further provided herein are techniques that can be used to maximize the availability of free/solar cooling through factors, such as data center location. The location of a data center can be a significant factor in determining operational costs—in particular energy cost. FIG. 6 is a diagram illustrating exemplary methodology 600 for optimizing location of a data center so as to maximize the availability of free/solar cooling. In step 602, a particular region (e.g., State of California) is defined. In step 604, the region is then sectioned into n number of climate zones. The granularity of the sectioning is given by the changes in the climate (temperature and sun irradiation) and required result of the optimization process. In some instances, it might be preferable to use building code climate zones and/or agricultural zones (e.g., San Joaquin Valley, Sacramento Valley, Central Coast, North Coast, Sierra Nevada Foothills and Southern California).

In step 606, for a given climate zone i, i.e., i=0, outside temperature data (which relates to free cooling) and/or sun irradiation data (which relates to solar cooling) are gathered at an appropriate time interval frequency throughout the year. According to the exemplary embodiment shown illustrated in FIG. 6 the availability of both free and solar cooling is being considered. However, this is not a requirement. For example, the steps outlined in FIG. 6 are also applicable to instances where free cooling, or alternatively solar cooling, is alone being considered. In that case, either outside temperature or sun irradiation data is gathered.

The time interval chosen can be based on a response time to be able to switch the cooling supply from chiller (standard cooling) to the cooling tower (free cooling) and/or to the solar cooling unit (solar cooling). A conservative time interval is one hour. The time interval can comprise a user input into the methodology.

In step 608, an amount of free cooling available, if any, is determined for each time interval associated with climate zone i (i.e., whether or not there is an opportunity to bypass the modular refrigeration chiller units). The amount of free cooling available can be calculated based on ambient air temperatures and required discharge temperatures of the air handling system in the data center, $T_{RF,in}$ (e.g., by comparing ambient air temperatures and desired data center temperatures). See description above. A typical value for $T_{RF,in}$ would be 58° F., which corresponds to a cooled water supply temperature of approximately 44° F. Taking a small temperature drop in the heat exchanger(s) (i.e., ACUs) into account such a setting could bypass the modular refrigeration chiller units when the outside temperature is below about 42° F. The required discharge temperature $T_{RF,in}$ can comprise another user input into the methodology. Step 608 would not be performed if, as highlighted above, only solar cooling was being considered.

In step 610, an amount of solar cooling available, if any, is determined for each of the time intervals associated with climate zone i. For example, available solar cooling power is calculated for each of the time intervals associated with climate zone i. As highlighted above, solar cooling is available if the available sunlight energy is greater than the minimum amount of sunlight energy needed for solar cooling, based on a comparison thereof. User inputs into the methodology at this step can include, but are not limited to, an area of the solar collectors, the sun irradiation data (see step 606, described above), collection efficiency and coefficient of performance (COP) of the absorption (abs.) refrigeration system. The COP of the absorption refrigeration system depends on the sun irradiation data (or temperature of the heat medium, i.e., the operating temperature capability of the fluid medium of the absorption refrigeration system (see above), for example if water is being used as the fluid medium at atmospheric pressure then the heat medium temperature would be 100 degrees Celsius (° C.) or less), loading and other parameters, which can be taken into account. Step 610 would not be performed if, as highlighted above, only free cooling was being considered.

Based on the amounts of free cooling (step 608) and solar cooling (step 610) available, in step 612, a remaining amount of cooling power needed (i.e., above what is provided by the free and/or solar cooling) is determined for each of the time intervals associated with climate zone i. This remaining cooling power is also referred to herein as "remaining chiller power" since it is equivalent to the power consumed by the modular refrigeration chiller units. The remaining chiller power can be calculated by subtracting the available free cooling power (see step 608, above) and/or the available solar cooling power (see step 610, described above) from a required cooling power for each of the time intervals. The required cooling power is given by a total power in the raised floor cooling infrastructure of the data center. The required cooling power can comprise yet another user input into the methodology.

In general, once the outside temperature is below a threshold temperature the whole data center can operate on free cooling, i.e., no modular refrigeration chiller units are needed and no solar cooling is needed. The assumption is that free cooling is infinite, which is a reasonable assumption. That is why the free cooling is a "square function" either available or not. For example, cooling power (P) may be defined as:

for free cooling: P_total_heat_load=P_free cooling for no free cooling: P_total_heat_load=Pchiller+Psolar cooling.

In step 614, the remaining chiller power throughout the year is calculated for climate zone i. This calculation is carried out by averaging the remaining chiller power throughout one year for the respective climate zone (e.g., in the simplest case by adding up the hourly power over a year and dividing by the number of hours). Basically, this calculation determines the remaining amount of cooling power needed (i.e., above what is provided by the free and/or solar cooling) for climate zone i for a year. In step 616, a determination is then made as to whether there are additional climate zones within the region, i.e., whether i=n. If there are additional climate zones within the region, then steps 606-614 are repeated for each additional climate zone (i+1, i+2, etc.) until i=n.

In step 618, the remaining chiller power (i.e., a remaining amount of cooling power needed above what is provided by the free and/or solar cooling) for the different climate zones (over the one year period) within the region are compared to identify an optimum location for the respective data center, i.e., the climate zone within the region that offers the lowest remaining chiller power (i.e., the climate zone within the region that has the lowest amount of cooling needed above what can be provided by free and/or solar cooling). The term "chiller power" refers to an instantaneous value of the power being consumed by a given chiller at a point in time. Thus, the remaining chiller power can be thought of as an average rate of energy usage over a specific period of time (in this case over a period of one year). Example code for optimizing location of a data center so as to maximize the availability of free/solar cooling is provided below.

Given the above teachings, according to an exemplary embodiment, a method for optimizing location of a data center includes defining a particular region for locating the data center, sectioning the region into a plurality of climate zones, gathering one or more of temperature and sun irradiation data for a given one of the climate zones at a particular time interval frequency throughout the year, determining one or more of an amount of free cooling and an amount of solar cooling available for each of the time intervals associated with the given climate zone, determining a remaining amount of cooling needed above what can be provided by one or more of the free and the solar cooling for each of the time intervals associated with the given climate zone, determining the remaining amount of cooling needed above what can be provided by one or more of the free and the solar cooling for the given climate zone for one year and comparing the remaining amount of cooling needed above what can be provided by one or more of the free and the solar cooling for each climate zone within the region to identify an optimum location for the data center. The step of determining one or more of an amount of free cooling and an amount of solar cooling available can further include comparing ambient air temperatures and a desired data center temperature. The step of determining one or more of an amount of free cooling and an amount of solar cooling available can further include comparing available sunlight energy to a minimum amount of sunlight energy needed for solar cooling. The optimum location for the data center can be a given one of the climate zones within the region that has the lowest amount of cooling needed above what can be provided by one or more of the free and the solar cooling.

The step of calculating a remaining chiller power can further include subtracting the available solar power from a required cooling power for each of the time intervals. The step of determining the remaining amount of cooling needed above what can be provided by one or more of the free and the solar cooling for the given climate zone for one year can further include averaging the remaining amount of cooling needed above what can be provided by one or more of the free and the solar cooling throughout one year for the given climate zone. The step of calculating a remaining chiller usage can further include averaging the remaining chiller power throughout one year for the given climate zone. The method can further include determining whether there are additional climate zones within the region and repeating the steps of gathering one or more of temperature and sun irradiation data, determining one or more of an amount of free cooling and an amount of solar cooling available, determining a remaining amount of cooling needed above what can be provided by one or more of the free and the solar cooling, determining the remaining amount of cooling needed above what can be provided by one or more of the free and the solar cooling for one year, comparing the remaining amount of cooling needed above what can be provided by one or more of the free and the solar cooling for each climate zone within the region to identify an optimum location for the data center and determining whether there are additional climate zones within the region.

FIGS. 7A-D are graphs depicting methodology 600 of FIG. 6 being carried out for one climate zone. Specifically, in FIG. 7A a range of ambient air temperatures (labeled "Outside Temperatures") (measured in ° F.) are shown over approximately a 24 hour time span. In FIG. 7B, modular refrigeration chiller unit bypass opportunities (i.e., whether the modular refrigeration chiller units can be bypassed, see above) is shown based on durations of free cooling over the 24 hour time span. As shown in FIG. 7B, the modular refrigeration chiller units are generally turned off during the nighttime and on during the daytime. In FIG. 7C, available solar cooling is shown based on solar cooling (measured in watts (W) per square foot ($ft^2$)) over the 24 hour time span. A comparison of FIGS. 7A and 7C reveals that the availability of solar cooling is greatest during those hours when ambient air temperatures are the greatest. In FIG. 7D, remaining chiller usage is shown based on remaining chiller power (measured in $W/ft^2$) over the 24 hour time span, and represents those times when neither free cooling (FIG. 7B, e.g., during the daytime) nor solar cooling (FIG. 7C, e.g., during the nighttime) are available.

Figure 8:
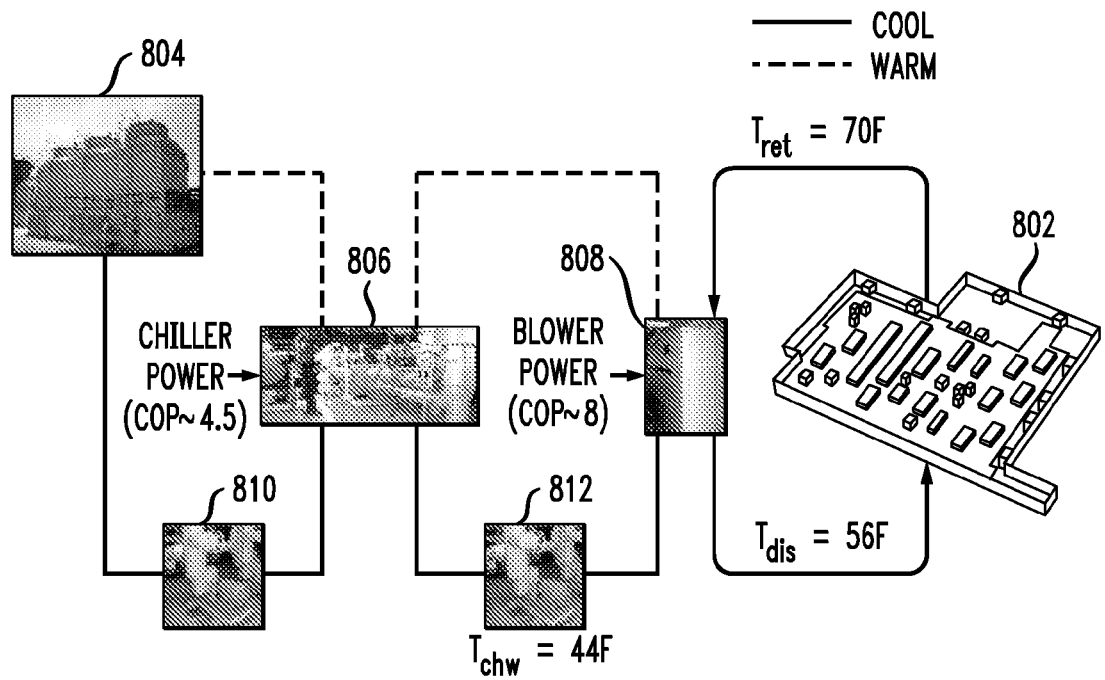
FIG. 8 is a diagram illustrating an exemplary data center cooling infrastructure that does not utilize free cooling or solar cooling.

FIG. 8 is a diagram illustrating exemplary data center cooling infrastructure 800 that does not utilize free cooling or solar cooling. Cooling infrastructure 800 comprises cooling tower 804, central chiller plant 806 and air handlers 808, all of which control the temperature inside of data center 802. Cooling infrastructure 800 utilizes two water loops, an external water loop to connect chiller plant 806 with cooling tower 804, and an internal water loop to connect chiller plant 806 with air handlers 808. Pumps 810 and 812 pump water through the external and internal water loops, respectively.

Figure 9:
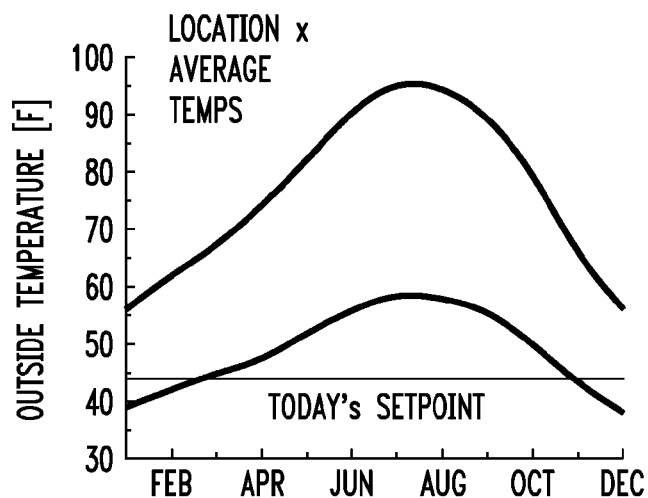
FIG. 9 is a graph illustrating a range of ambient air temperatures over a 12 month period for a data center location (e.g., the location of the data center of FIG. 8)

As shown in FIG. 8, a desired discharge temperature ($T_{dis}$) of 56° F. is chosen. Chilled water having a temperature ($T_{chw}$) of about 44° F. is supplied to air handlers 808 to achieve the $T_{dis}$ of 56° F. Return temperatures ($T_{ret}$) of about 70° F. can be experienced after data center 802 is cooled. To achieve these parameters, central chiller plant 806 has a COP of about 4.5 (based on chiller power) and air handlers 808 have a COP of about eight (based on blower power, i.e., power required by blowers within the air handlers to circulate the cooled air through the raised floor cooling infrastructure). FIG. 9 is a graph 900 of a range of ambient air temperatures (labeled "outside temperature") (measured in ° F.) over a 12 month period for a data center location x (e.g., where data center 802 of FIG. 8 is located). The top and bottom curves represent maximum and minimum monthly temperatures which reflect daytime and nighttime outside air temperatures, respectively. The graph along with the horizontal line showing "today's set point" shows that a low set point means that free cooling cannot be fully exploited because there are less time durations when the outside temperature will be lower than the set point temperature. A comparison of FIG. 9 with FIG. 12 (described below) illustrates that a higher set point allows for much more use of free cooling. The higher set point is affected via the use of the MMT technology. Namely, the use of MMT technology can improve the efficiency of the cooling system, thus potentially allowing for the set point to be raised (and therefore increasing the free cooling potential).

Figure 10:
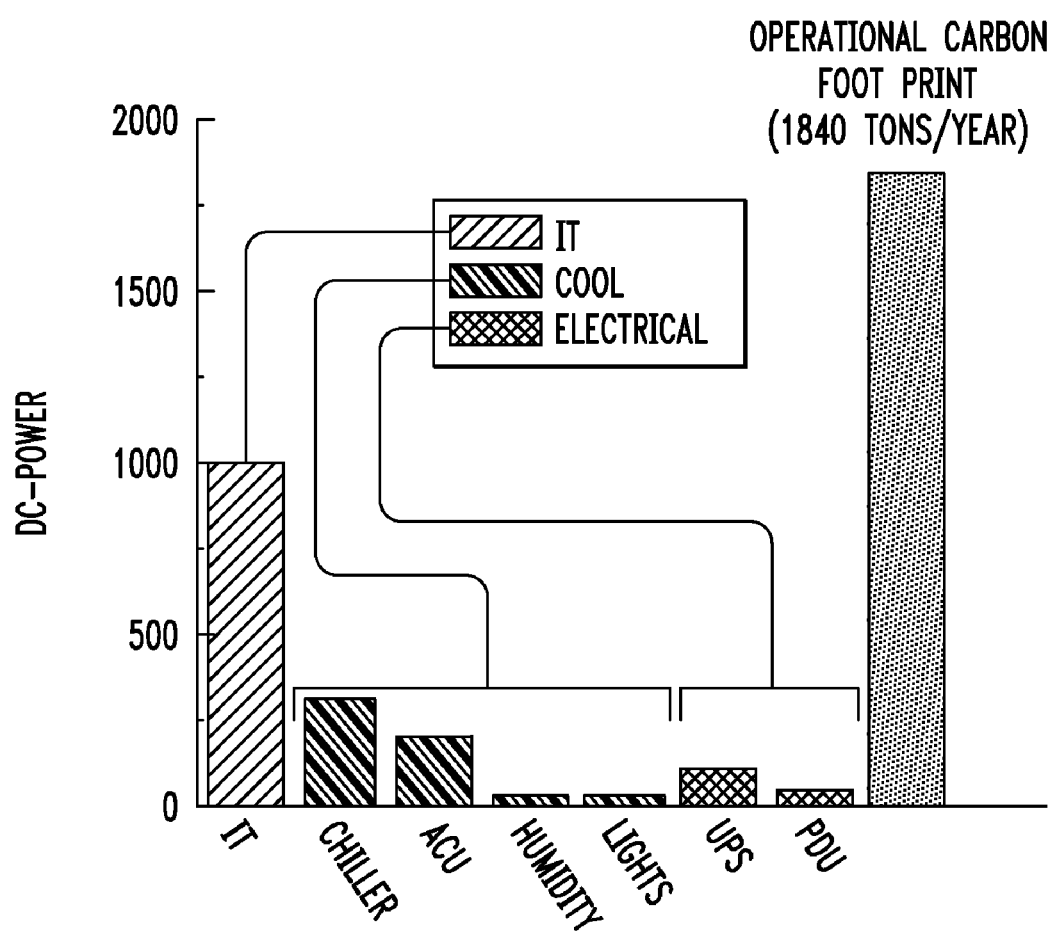
FIG. 10 is a graph illustrating a breakdown of power usage for information technology equipment, cooling infrastructure and electrical components for the data center of FIG. 8.

FIG. 10 is graph 1000 illustrating a breakdown of power usage for information technology (IT) equipment, cooling infrastructure (e.g., modular refrigeration chiller units, ACUs, humidity and electrical components (e.g., lights, power distribution units (PDUs) and uninterruptable power supplies (UPSs)) for data center (DC) 802 of FIG. 8. As shown in FIG. 10, an operational carbon foot print for data center 802 is 1,840 tons per year.

With regard to the humidity component, in data centers the ACUs often de-humidify (i.e., trigger condensation of water from the air stream) and then humidify in other areas (i.e., evaporate water into the air stream via, e.g., an electrical heater heating water that is exposed to the air stream). Thus, there is unnecessary work being done. There is some humidification needed to compensate for the moisture lost, for example, to the environment. However, there is much more energy spent in needless humidification and de-humidification. This is one of the known problems in data centers. This problem usually occurs because even though the absolute humidity (i.e., the water content in the air) generally remains the same, the relative humidity (which is what is measured) can vary hugely because it depends on the air temperature. The relative humidity is the ratio of the water content of the air to the maximum water content the air can absorb.

Figure 11:
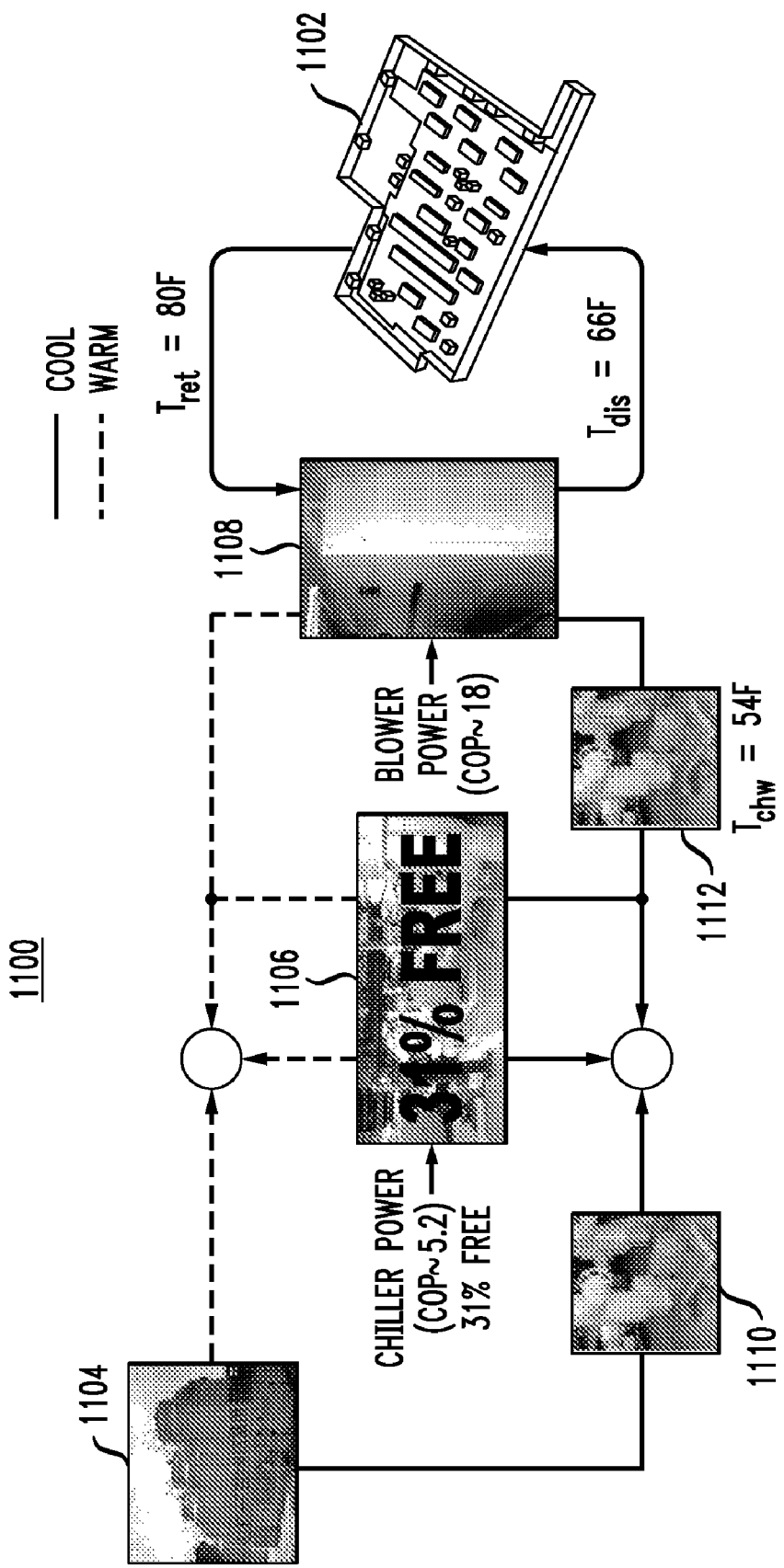
FIG. 11 is a diagram illustrating an exemplary data center cooling infrastructure that utilizes free cooling and/or solar cooling according to an embodiment of the present invention.

FIG. 11 is a diagram illustrating exemplary data center cooling infrastructure 1100 that utilizes 31 percent (%) free cooling and/or solar cooling. Cooling infrastructure 1100 comprises cooling tower 1104, central chiller plant 1106 and air handlers 1108, all of which control the temperature inside of data center 1102. Cooling infrastructure 1100 utilizes two water loops, an external water loop to connect chiller plant 1106 with cooling tower 1104, and an internal water loop to connect chiller plant 1106 with air handlers 1108. Pumps 1110 and 1112 pump water through the external and internal water loops, respectively.

Figure 12:
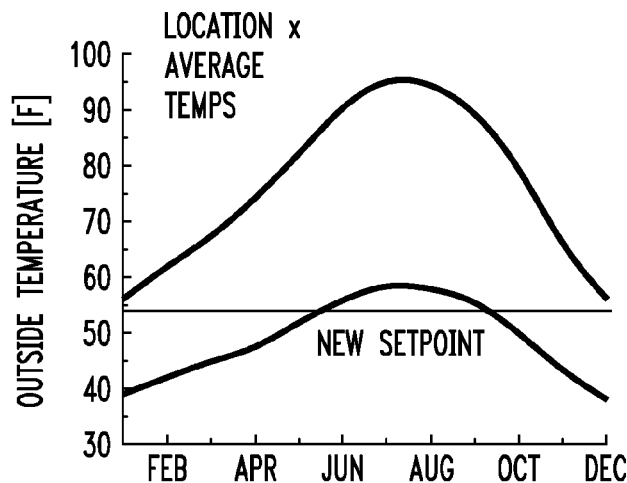
FIG. 12 is graph illustrating a range of ambient air temperatures over a 12 month period for a data center location (e.g., the location of the data center of FIG. 11) according to an embodiment of the present invention.

As shown in FIG. 11, a desired discharge temperature ($T_{dis}$) of 66° F. is chosen. Chilled water having a temperature ($T_{chw}$) of about 54° F. is supplied to air handlers 1108 to achieve the $T_{dis}$ of 66° F. Return temperatures ($T_{ret}$) of about 80° F. can be experienced after data center 1102 is cooled. To achieve these parameters, central chiller plant 1106 has a COP of about 5.2 (based on chiller power) and air handlers 1108 have a COP of about 18 (based on blower power). FIG. 12 is a graph 1200 of a range of ambient air temperatures (labeled "outside temperature") (measured in ° F.) over a 12 month period for a data center location x (e.g., where data center 1102 of FIG. 11 is located). The top and bottom curves represent maximum and minimum monthly temperatures which reflect daytime and nighttime outside air temperatures, respectively. The graph along with the horizontal line showing "today's set point" shows that a low set point means that free cooling cannot be fully exploited because there are less time durations when the outside temperature will be lower than the set point temperature.

Figure 13:
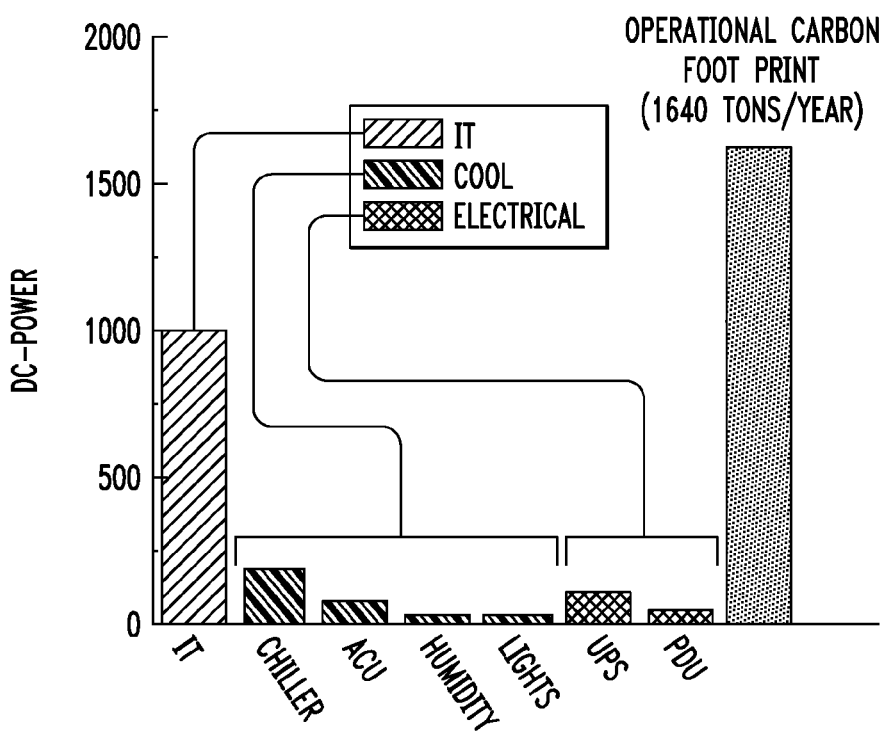
FIG. 13 is a graph illustrating a breakdown of power usage for information technology equipment, cooling infrastructure and electrical components for the data center of FIG. 11 according to an embodiment of the present invention.

FIG. 13 is graph 1300 illustrating a breakdown of power usage for information technology (IT) equipment, cooling infrastructure (e.g., modular refrigeration chiller units, ACUs, humidity and electrical components (e.g., lights, power distribution units (PDUs) and uninterruptable power supplies (UPSs)) for data center (DC) 1102 of FIG. 11. As shown in FIG. 13, an operational carbon foot print for data center 1102 is 1,640 tons per year (as compared with data center 802 of FIG. 8 having an operational carbon foot print of 1,840 tons per year, as shown in FIG. 10).

Figure 14:
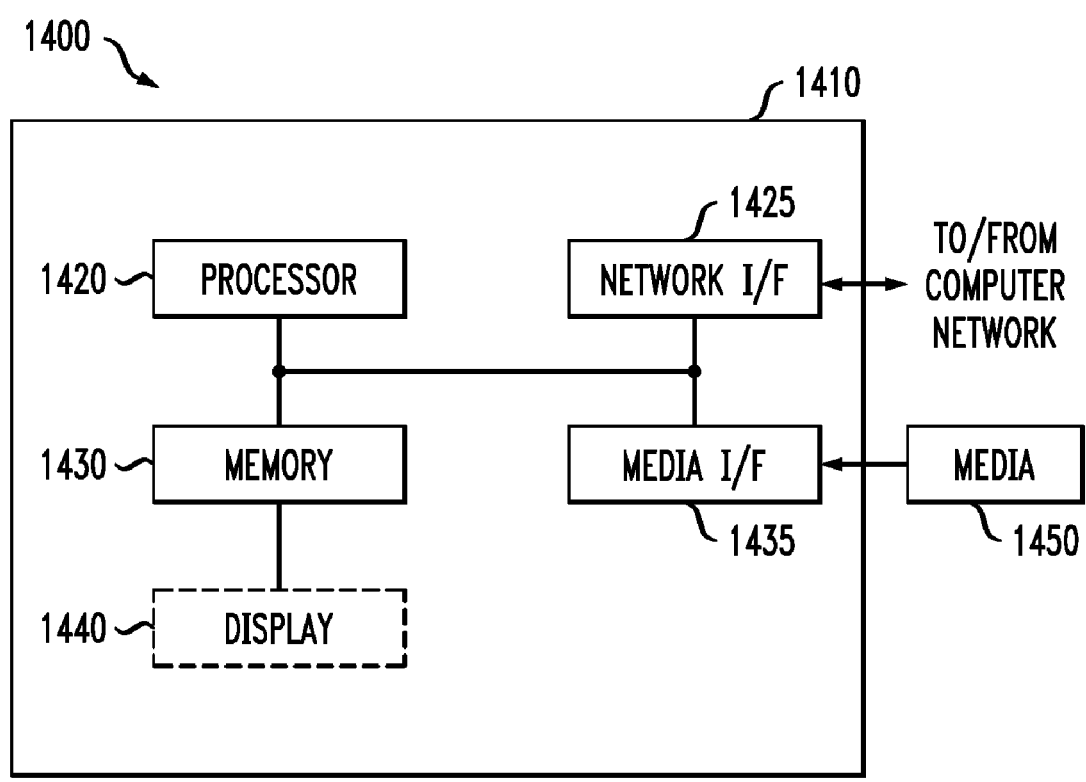
FIG. 14 is a diagram illustrating an exemplary apparatus for implementing one or more of the present methodologies according to an embodiment of the present invention.
Figure 15A:
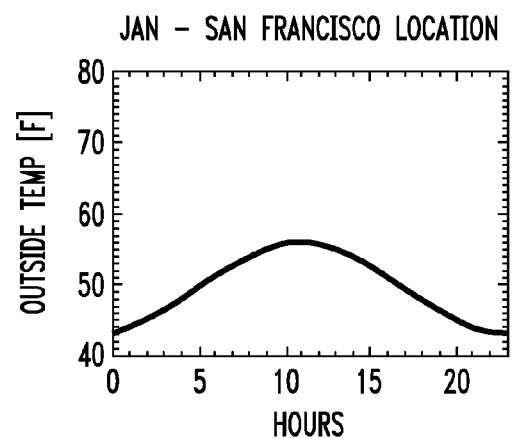
FIGS. 15A-D through FIGS. 26A-D are graphs illustrating an availability of free and solar cooling for a potential data center location over a twelve month period according to an embodiment of the present invention.
Figure 15B:
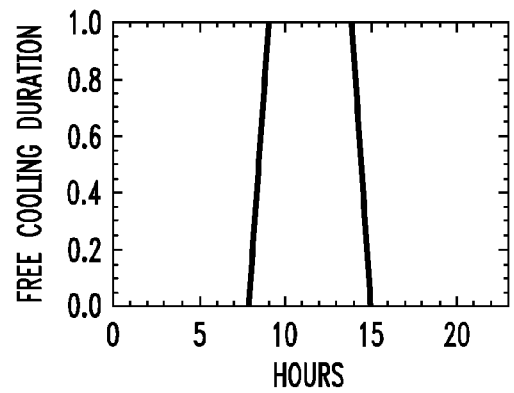
Figure 15C:
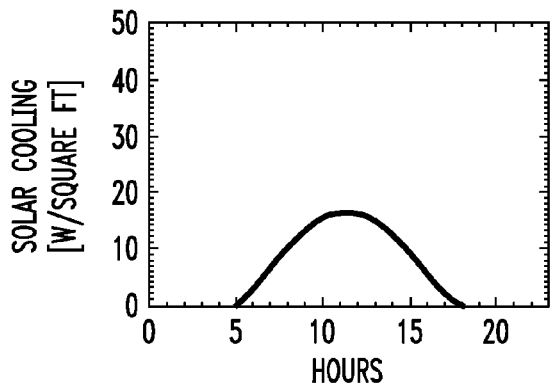
Figure 15D:
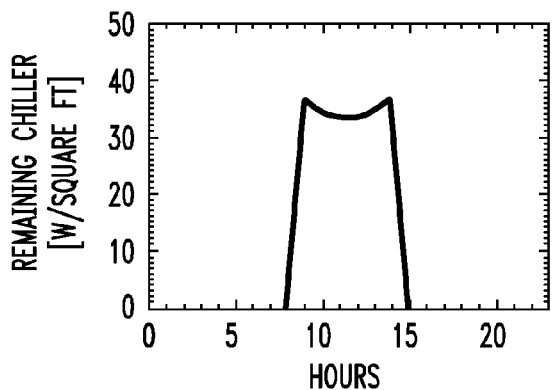
Figure 16A:
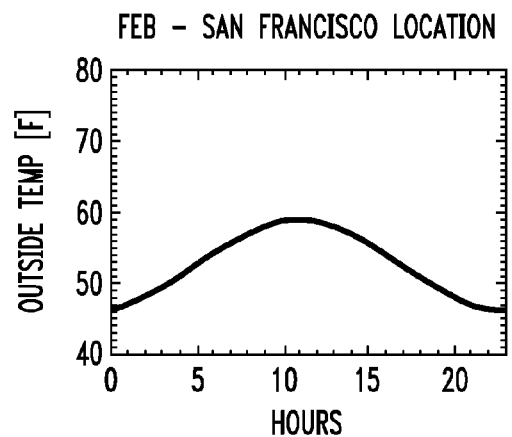
Figure 16B:
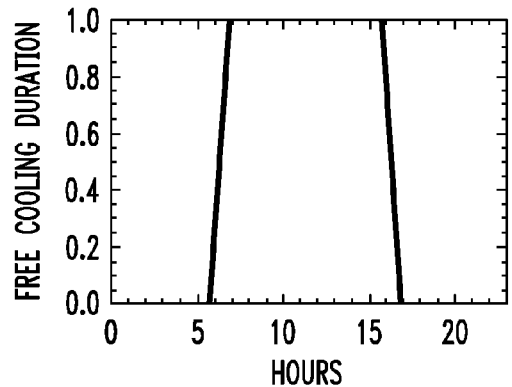
Figure 16C:
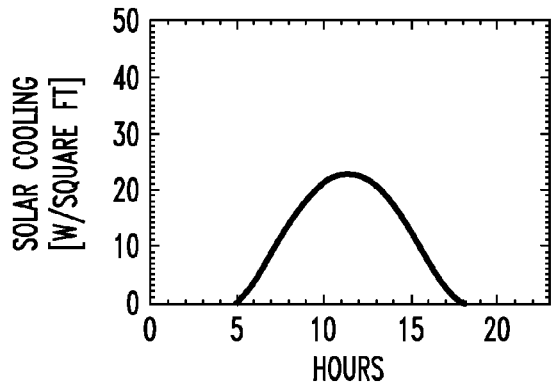
Figure 16D:
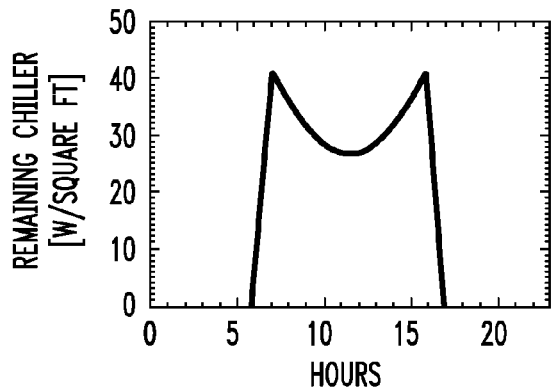
Figure 17A:
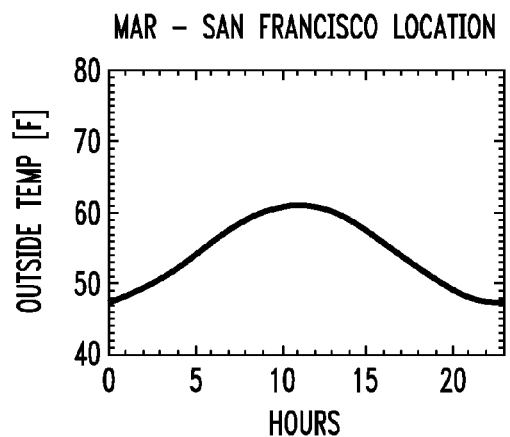
Figure 17B:
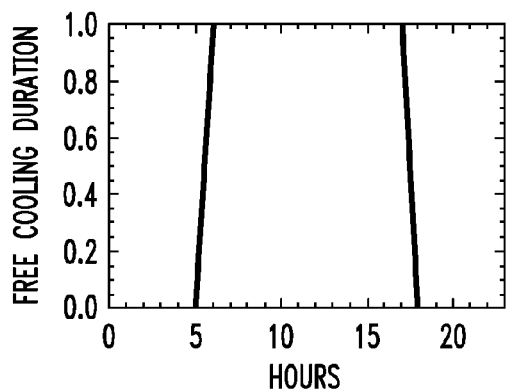
Figure 17C:
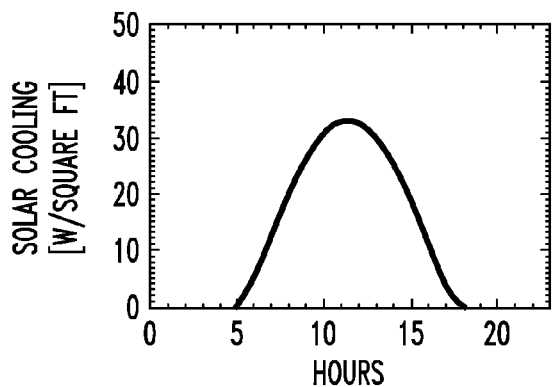
Figure 17D:
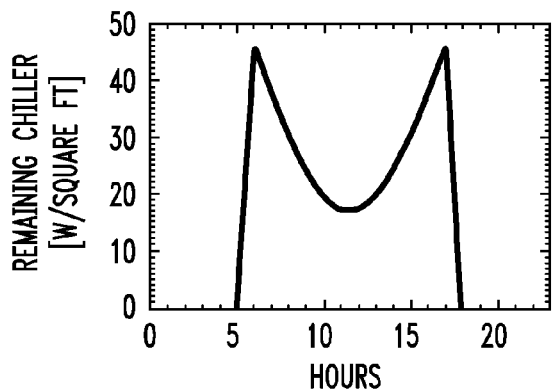
Figure 18A:
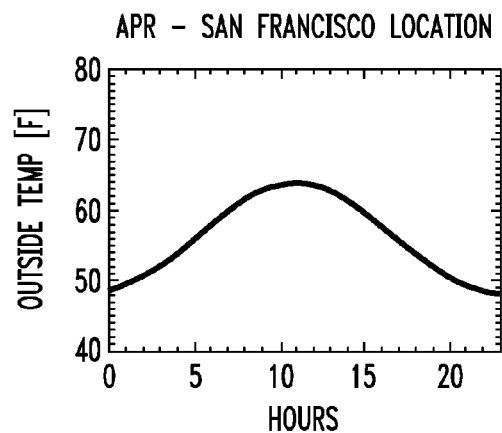
Figure 18B:
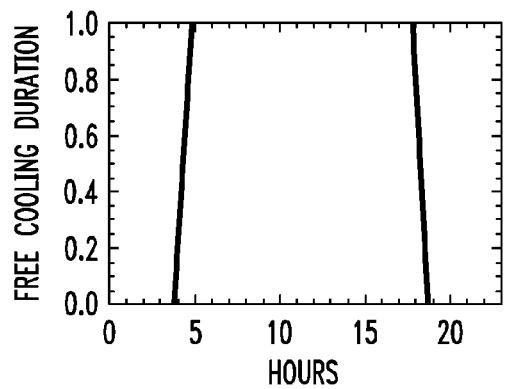
Figure 18C:
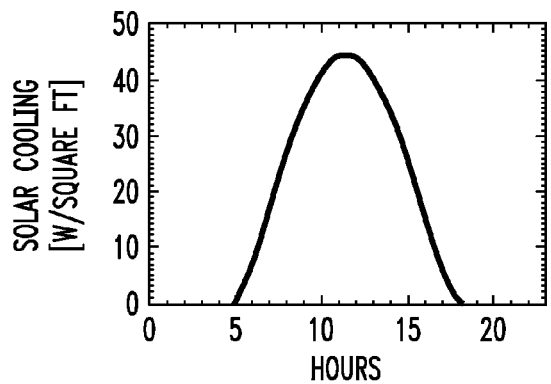
Figure 18D:
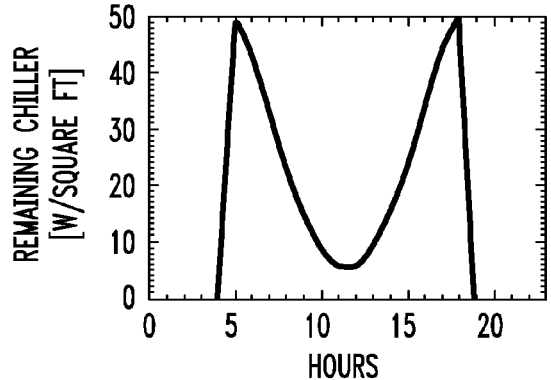
Figure 19A:
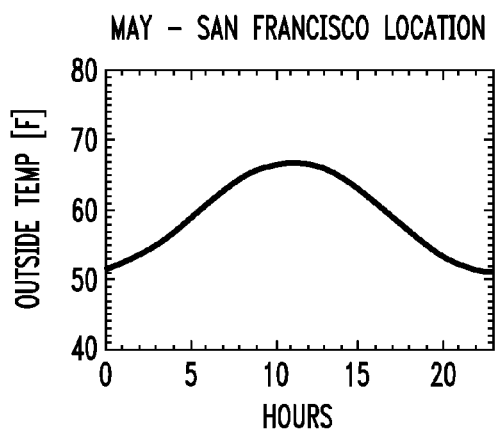
Figure 19B:
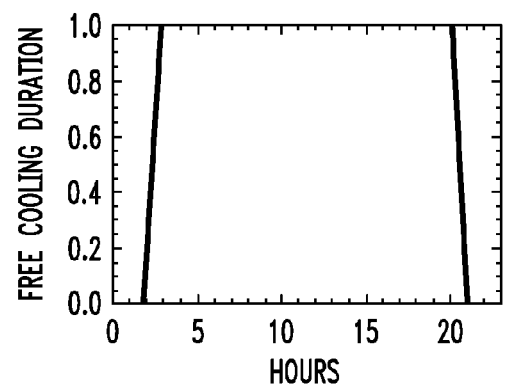
Figure 19C:
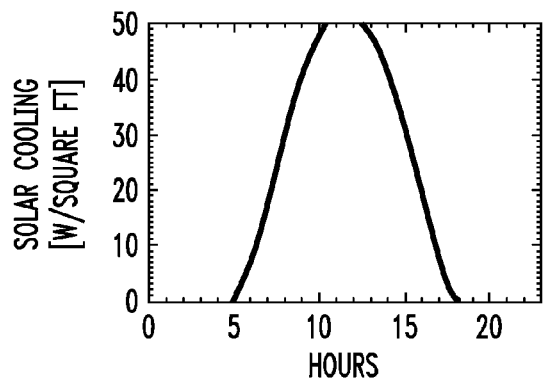
Figure 19D:
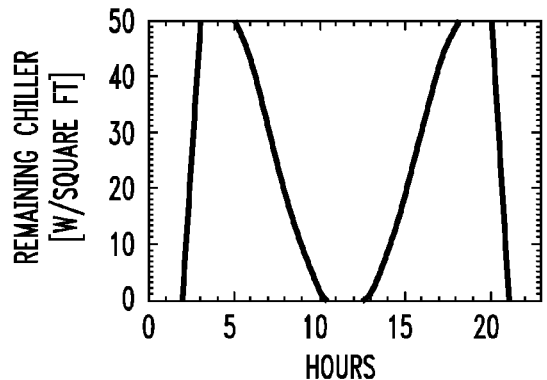
Figure 20A:
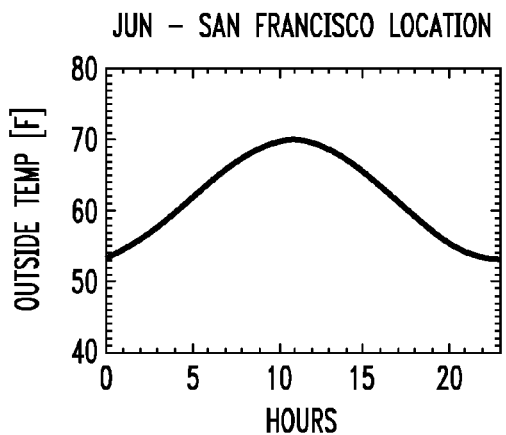
Figure 20B:
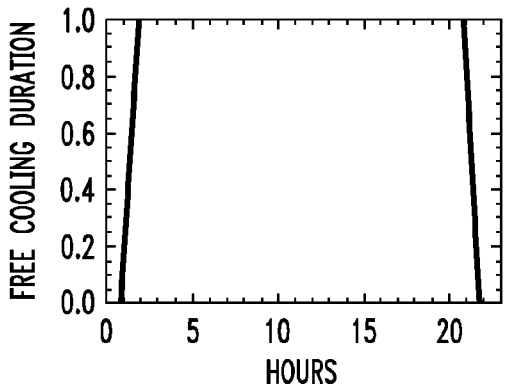
Figure 20C:
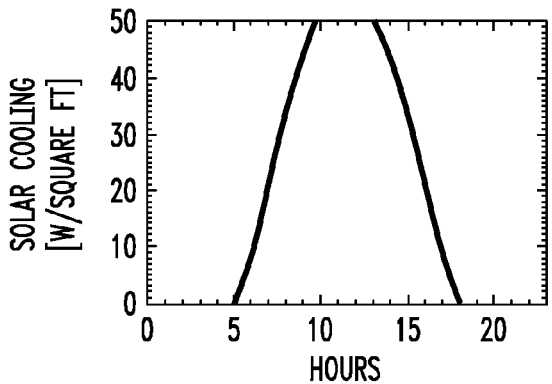
Figure 20D:
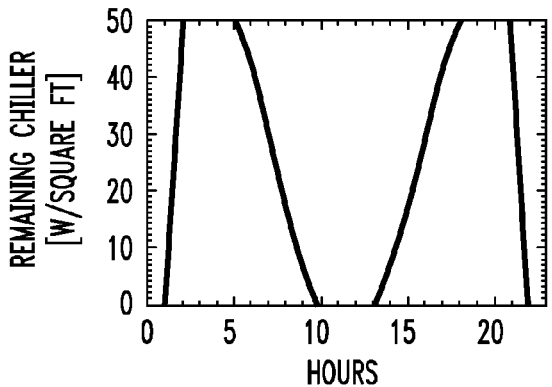
Figure 21A:
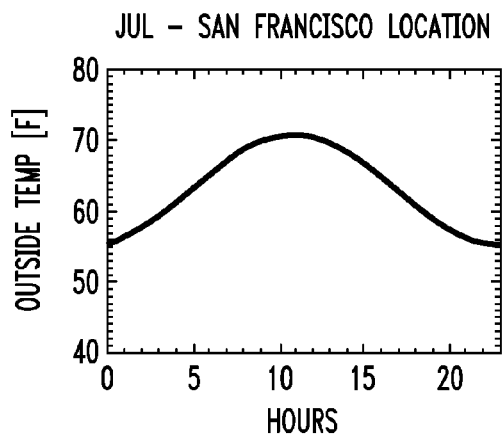
Figure 21B:
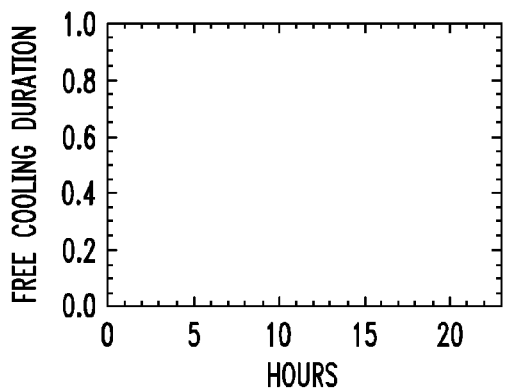
Figure 21C:
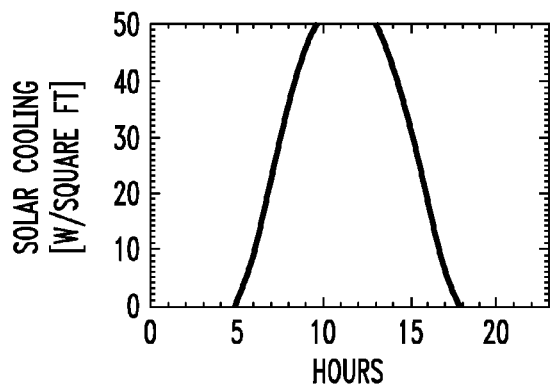
Figure 21D:
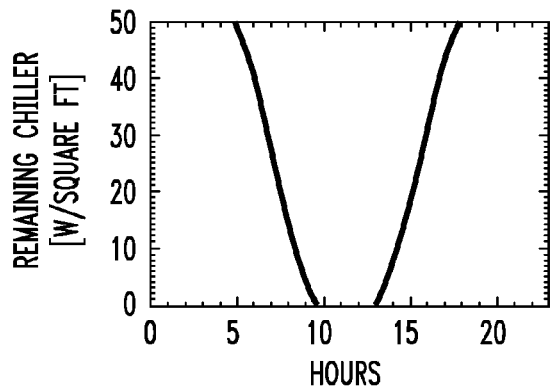
Figure 22A:
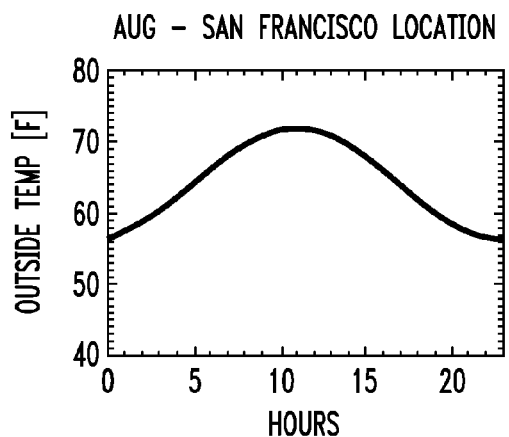
Figure 22B:
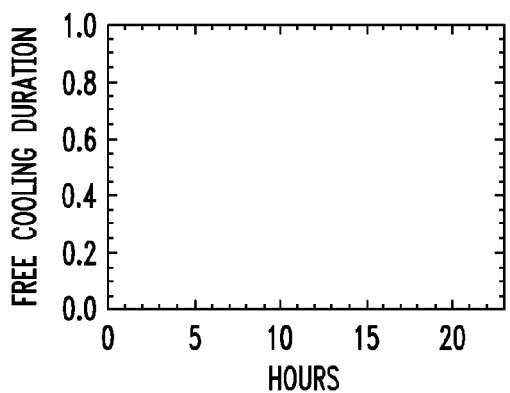
Figure 22C:
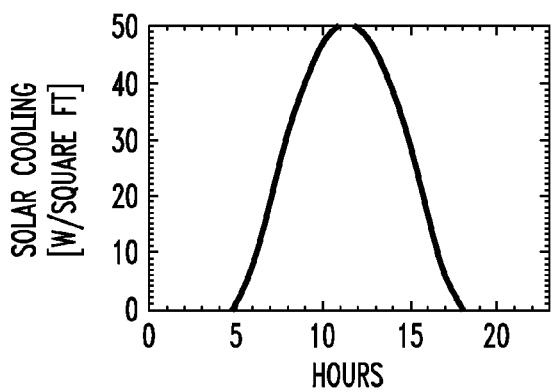
Figure 22D:
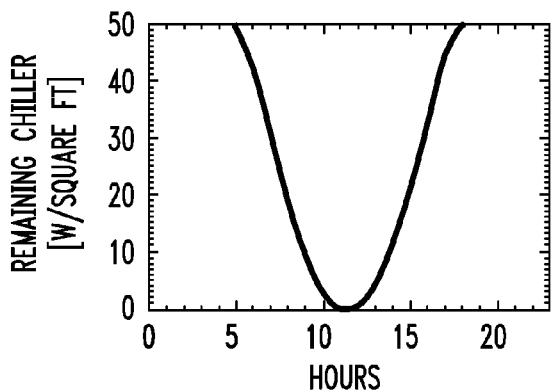
Figure 23A:
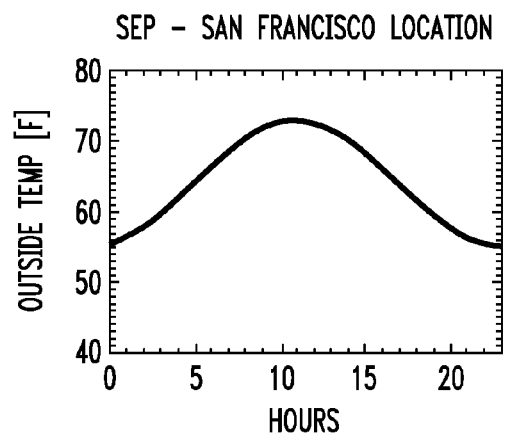
Figure 23B:
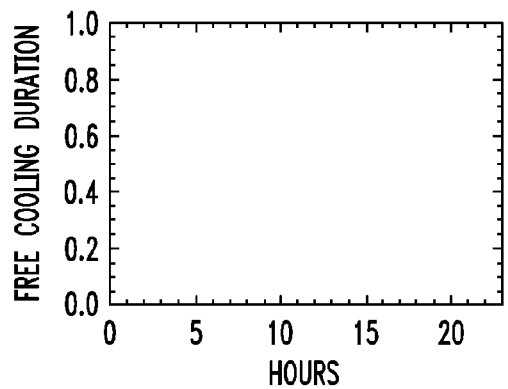
Figure 23C:
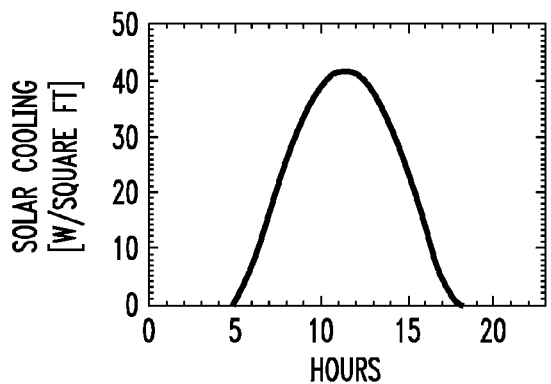
Figure 23D:
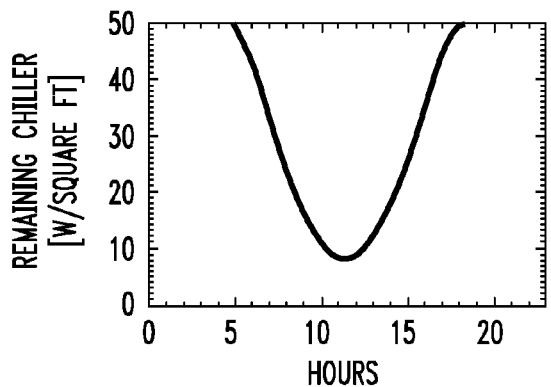
Figure 24A:
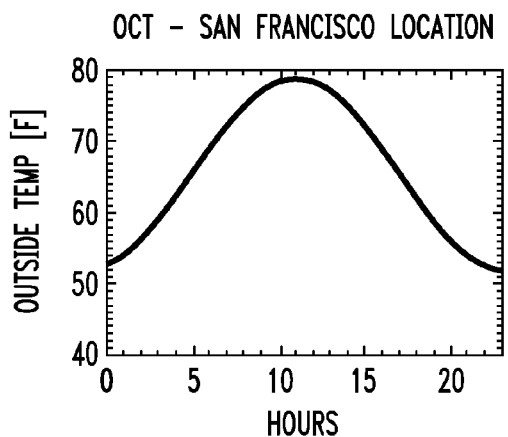
Figure 24B:
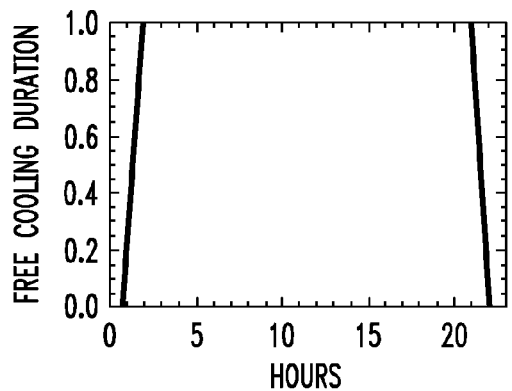
Figure 24C:
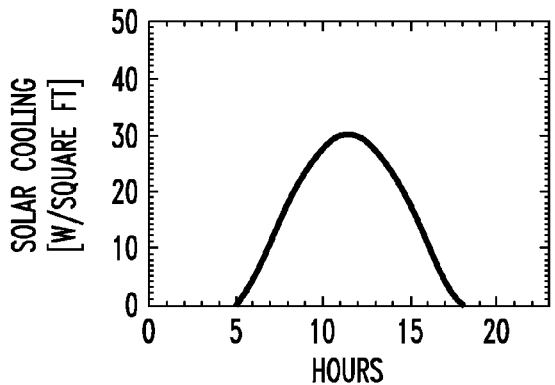
Figure 24D:
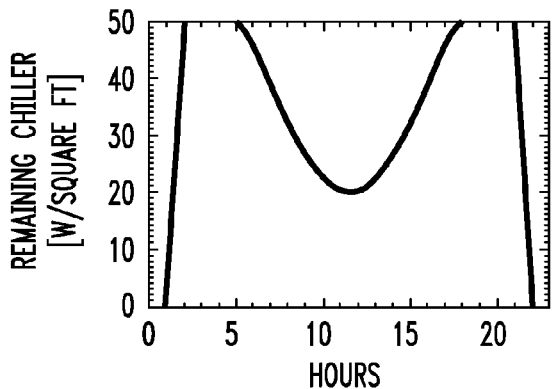
Figure 25A:
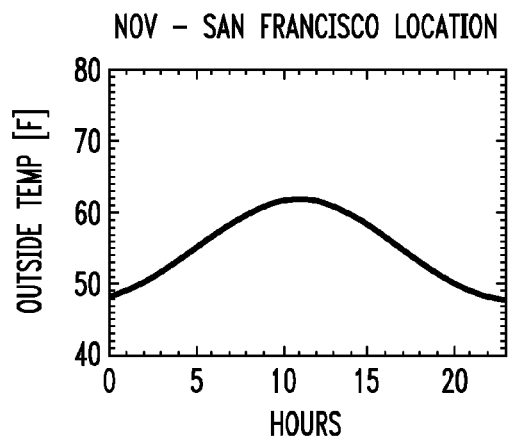
Figure 25B:
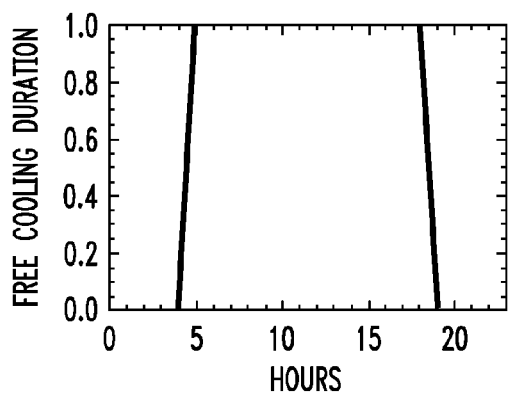
Figure 25C:
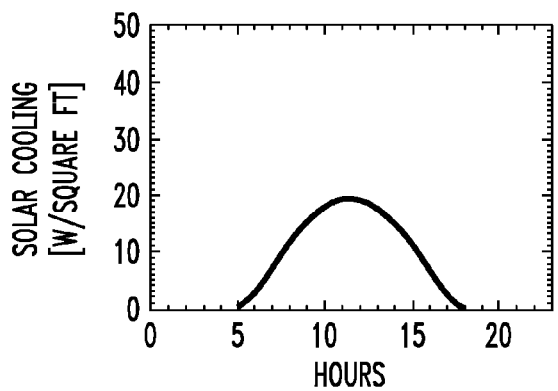
Figure 25D:
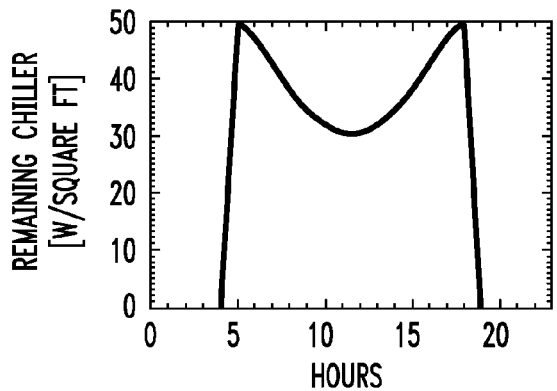
Figure 26A:
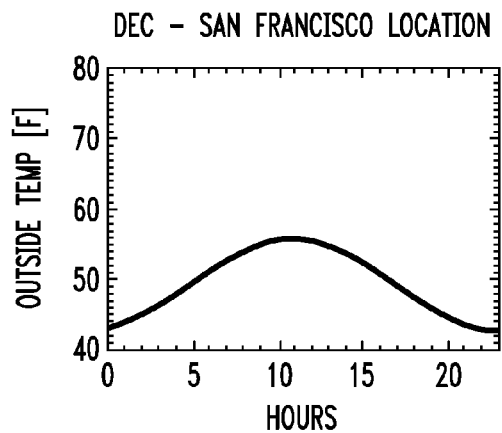
Figure 26B:
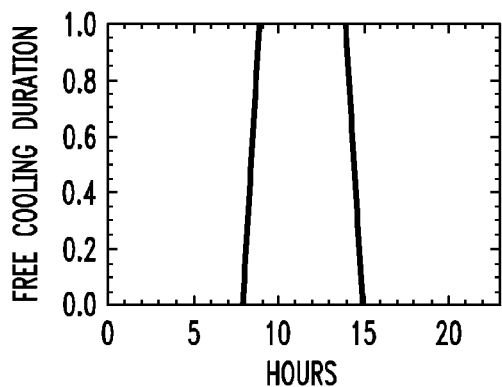
Figure 26C:
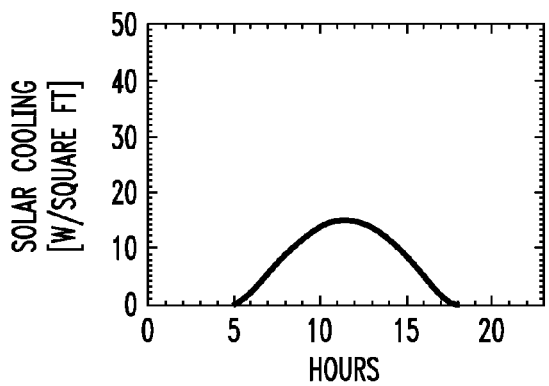
Figure 26D:
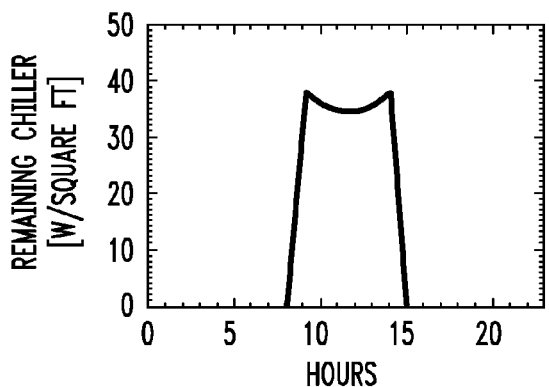

Turning now to FIG. 14, a block diagram is shown of an apparatus 1400 for implementing one or more or the methodologies presented herein. By way of example only, as highlighted above, apparatus 1400 can serve as control unit 214 and/or control unit 414 and thus can be configured to implement one or more of the steps of methodology 300 of FIG. 3 and/or methodology 500 of FIG. 5, respectively. Apparatus 1400 also represents one embodiment for implementing methodology 600 of FIG. 6, for optimizing location of a data center.

Apparatus 1400 comprises a computer system 1410 and removable media 1450. Computer system 1410 comprises a processor device 1420, a network interface 1425, a memory 1430, a media interface 1435 and an optional display 1440. Network interface 1425 allows computer system 1410 to connect to a network, while media interface 1435 allows computer system 1410 to interact with media, such as a hard drive or removable media 1450. When, for example, apparatus 1400 serves as control unit 214 and/or control unit 414, apparatus 1400 can interface with the various valves, sensors and other components (such as a fan(s)) by way of wired connections (for example as shown in FIG. 2 and FIG. 4) or alternatively by way of one or more wireless connections (not shown).

As is known in the art, the methods and apparatus discussed herein may be distributed as an article of manufacture that itself comprises a machine-readable medium containing one or more programs which when executed implement embodiments of the present invention. For instance, according to the exemplary embodiment wherein apparatus 1400 serves as control unit 214 and is configured to implement one or more of the steps of methodology 300, and wherein a cooling system is provided having a cooling tower, one or more modular refrigeration chiller units, and a water loop that can be selectively directed through the cooling tower, through one or more of the modular refrigeration chiller units or through a combination thereof, wherein the water loop is configured to, at an interface with the data center, receive a heat load from the data center, and to deliver chilled water back to the interface with the data center, the machine-readable medium may contain a program configured to compare an ambient air temperature to a desired data center temperature; and selectively direct the water loop through the cooling tower or through a combination of the cooling tower and one or more of the modular refrigeration chiller units if the ambient air temperature is less than a desired data center temperature, otherwise repeat the step of comparing the ambient air temperature to the desired data center temperature at a given time interval if the ambient air temperature is greater than a desired data center temperature.

Further, according to the exemplary embodiment wherein apparatus 1400 serves as control unit 414 and is configured to implement one or more of the steps of methodology 500, and wherein a cooling system is provided having a solar cooling unit, one or more modular refrigeration chiller units, and a water loop that can be selectively directed through the solar cooling unit, through one or more of the modular refrigeration chiller units or through a combination thereof, wherein the water loop is configured to, at an interface with the data center, receive a heat load from the data center, and to deliver chilled water back to the interface with the data center, the machine-readable medium may contain a program configured to compare available sunlight energy to a minimum amount of sunlight energy needed for solar cooling; and selectively direct the water loop through the solar cooling unit or through a combination of the solar cooling unit and one or more of the modular refrigeration chiller units if the available sunlight energy is greater than the minimum amount of sunlight energy needed for solar cooling, otherwise repeat the step of comparing the available sunlight energy to the minimum amount of sunlight energy needed for solar cooling at a given time interval if the available sunlight energy is less than the minimum amount of sunlight energy needed for solar cooling.

Yet further, according to the exemplary embodiment wherein apparatus 1400 represents one embodiment for implementing methodology 600, the machine-readable medium may contain a program configured to define a particular region for locating the data center; section the region into a plurality of climate zones; gather one or more of temperature and sun irradiation data for a given one of the climate zones at a particular time interval frequency throughout the year; determine one or more of an amount of free cooling and an amount of solar cooling available for each of the time intervals associated with the given climate zone; determine a remaining amount of cooling needed above what can be provided by one or more of the free and the solar cooling for each of the time intervals associated with the given climate zone; determine the remaining amount of cooling needed above what can be provided by one or more of the free and the solar cooling for the given climate zone for one year; and compare the remaining amount of cooling needed above what can be provided by one or more of the free and the solar cooling for each climate zone within the region to identify an optimum location for the data center.

The machine-readable medium may be a recordable medium (e.g., floppy disks, hard drive, optical disks such as removable media 1450, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used.

Processor device 1420 can be configured to implement the methods, steps, and functions disclosed herein. The memory 1430 could be distributed or local and the processor device 1420 could be distributed or singular. The memory 1430 could be implemented as an electrical, magnetic or optical memory, or any combination of these or other types of storage devices. Moreover, the term "memory" should be construed broadly enough to encompass any information able to be read from, or written to, an address in the addressable space accessed by processor device 1420. With this definition, information on a network, accessible through network interface 1425, is still within memory 1430 because the processor device 1420 can retrieve the information from the network. It should be noted that each distributed processor that makes up processor device 1420 generally contains its own addressable memory space. It should also be noted that some or all of computer system 1410 can be incorporated into an application-specific or general-use integrated circuit.

Optional video display 1440 is any type of video display suitable for interacting with a human user of apparatus 1400. Generally, video display 1440 is a computer monitor or other similar video display.

The present teachings are further illustrated by the following non-limiting example. As shown in FIGS. 15A-D through FIGS. 26A-D, the availability of free and solar cooling was evaluated for a potential data center location in San Francisco, Calif. over a twelve month period (from January through December, wherein FIGS. 15A-D are graphs representing data collected for a single day in the month of January, FIGS. 16A-D are graphs representing data collected for a single day in the month of February, and so on). The same four parameters were evaluated during each month. For example, by way of reference to FIGS. 15A-D, for January, outside temperature (measured in ° F.) (FIG. 15A), free cooling duration (i.e., length of time for which free cooling is a viable option) (FIG. 15B), solar cooling (measured in Watts per square foot (W/square ft.)) (FIG. 15C) and remaining chiller usage (measured in W/square ft.) (FIG. 15D) parameters were all measured over a 24 hour period. As FIGS. 15A-D through FIGS. 26A-D illustrate, as the outside temperature rises and there are fewer hours of free cooling available, there is a corresponding increase in the number of hours of solar cooling available. These results indicate that selecting a data center location that maximizes available free/solar cooling is a viable option to augment conventional data center cooling systems.

The following is example code for optimizing location of a data center so as to maximize the availability of free/solar cooling.

```
function free_cool,tmax,tmin,tset
  t=fltarr(24)
  fr=intarr(24)
  fr(*)=0
  h=0.5
  q=0
  repeat begin
    t(q)=(tmax−tmin)*((cos(h*3.1415927/12.0+3.1515927)+1)/2.0)+tmin
    if t(q) GT tset then fr(q)=1
    h=h+1.0
    q=q+1
  endrep until h GT 24.0
  return,fr
end
function temp,tmax,tmin
  h=findgen(24)+1.0
  t=(tmax−tmin)*((cos(h*3.1415927/12.0+3.1515927)+1)/2.0)+tmin
  return,t
end
function rad,irr      ; different day hour length needs to be added
  r=fltarr(24)
```

-continued

```
h=0.5
q=0
neff=0.5           ;collection efficiency
COP=0.6            ;absorption refrigeration
repeat begin
  r(q)=cos(h*3.1415927/12.0+3.1415927)
  if r(q) LT 0 then r(q)=0.0
  h=h+1.0
  q=q+1
endrep until h GT 24.0
r=r/sum(r)*irr*24.0
r=r*neff*COP/10.0*2       ;factor 2x oversizing
return,r
end
Pro DC_weather
 thigh=fltarr(12)
 tlow=fltarr(12)
 hours=fltarr(12)
 irr=fltarr(12)
 ut=0
hours=[9.89,10.13,11.74,12.89,13.84,14.34,14.14,13.32,12.21,
11.10,10.13,9.66]
 thigh=[56,59,61,64,67,70,71,72,73,79,62,56]    ;SF highs
 tlow=[43,46,47,48,51,53,55,56,55,52,48,43]     ;SF lows
;thigh=[56,62,67,74,82,91,96,95,90,80,65,56]    ;FF highs
;tlow=[39,42,45,47,52,56,59,58,56,50,43,38]     ;FF lows
 irr=[680,940,1340,1800,2120,2270,2330,2060,1700,1230,
790,620]    ;SF
irradiation in BTU/square ft per day
;irr=[610,940,1370,1870,2280,2490,2520,2230,1810,1280,
760,550]    ;FF
irradiation in BTU/square ft per day
 irr=irr/9.29E-2/3.416/24         ;convert over to
W/m2
 cooling_chiller=fltarr(24)
 cooling_demand=50.0
 tset=54.0
 for m=1,12 do begin
; Window,0
; plot,temp(thigh(m-1),tlow(m-1)),YRange=[40,80]
; Window,1
; plot,free_cool(thigh(m-1),tlow(m-1),tset),YRange=[0,1]
; Window,2
; plot,rad(irr(m-1)),YRange=[0,50]
  cooling_chiller=(cooling_demand-rad(irr(m-1)))*free_cool(thigh(m-
1),tlow(m-1),tset)
; cooling_chiller=(cooling_demand-rad(irr(m-1)))
  !P.Multi = [0, 2, 2, 0, 0]
  !X.Style=1
  !Y.Style=1
  Window,0,Title=string(m)+'month'
  plot,temp(thigh(m-1),tlow(m-
1)),XRange=[0,23],YRange=[40,80],YTitle='outside temp
[F]',XTitle='hours'
  plot,cooling_chiller,XRange=[0,23],YRange=[0,50],YTitle='remaining
chiller [W/square ft]',XTitle='hours'
  plot,free_cool(thigh(m-1),tlow(m-1),tset),XRange=[0,23],
YRange=[0,1],YTitle='free cooling duration',XTitle='hours'
  plot,rad(irr(m-1)),XRange=[0,23],YRange=[0,50], YTitle='solar cooling
[W/square ft]',XTitle='hours'
  im=TVRD(0)
  name=strcompress('c:\trash\month'+string(m)+'.jpg')
  image = image_create(im, File_type = 'jpg')
  status=image_write(name,image)
  print,m,sum(cooling_chiller)/(50*24)
  ut=ut+sum(cooling_chiller)/(50*24)
  hak,msg
 end
 print,ut/12
end
```

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A data center cooling system comprising:
a cooling tower;
one or more modular refrigeration chiller units;
a water loop that can be selectively directed through the cooling tower, through one or more of the modular refrigeration chiller units or through a combination thereof, wherein the water loop is configured, at an interface with the data center, to receive a heat load from the data center, and to deliver chilled water back to the interface with the data center;
a control unit configured to control direction of the water loop through the cooling tower, through one or more of the modular refrigeration chiller units or through a combination thereof;
a first water temperature sensor configured to measure water temperatures at a point in the water loop where the heat load from the data center is received; and
a second water temperature sensor configured to measure water temperatures at a point in the water loop where the chilled water is delivered back to the data center,
wherein both the first water temperature sensor and the second water temperature sensor are connected to and monitored by, the control unit.

2. The cooling system of claim 1, further comprising a valve which under direction of the control unit is adapted to selectively direct at least a portion of the water loop through the cooling tower, through one or more of the modular refrigeration chiller units or through a combination thereof.

3. The cooling system of claim 1, further comprising an air temperature and relative humidity sensor configured to measure air temperature and relative humidity of the ambient air connected to, and monitored by, the control unit.

4. The cooling system of claim 1, further comprising a solar cooling unit through which the water loop can also be directed, wherein the water loop can be selectively directed through the cooling tower, through the solar cooling unit, through one or more of the modular refrigeration chiller units, through a combination of the cooling tower and one or more of the modular refrigeration chiller units or through a combination of the solar cooling unit and one or more of the modular refrigeration chiller units.

5. A method of cooling a data center, comprising the steps of:
providing a cooling system comprising a cooling tower, one or more modular refrigeration chiller units, and a water loop that can be selectively directed through the cooling tower, through one or more of the modular refrigeration chiller units or through a combination thereof, wherein the water loop is configured to, at an interface with the data center, receive a heat load from the data center, and to deliver chilled water back to the interface with the data center;
comparing an ambient air temperature to a desired data center temperature; and
selectively directing the water loop through the cooling tower or through a combination of the cooling tower and one or more of the modular refrigeration chiller units if the ambient air temperature is less than a desired data center temperature, otherwise repeating the step of comparing the ambient air temperature to the desired data center temperature at a given time interval if the ambient air temperature is greater than a desired data center temperature.

6. The method of claim 5, further comprising the step of:
obtaining one or more of water temperature in the water loop, water flow rate through the water loop, air flow rate through the cooling tower, ambient air temperature and relative humidity.

7. The method of claim 5, wherein the cooling system further comprises a solar cooling unit through which the water loop can also be directed, the method further comprising the steps of:
comparing available sunlight energy to a minimum amount of sunlight energy needed for solar cooling; and
selectively directing the water loop through the solar cooling unit or through a combination of the solar cooling unit and one or more of the modular refrigeration chiller units if the available sunlight energy is greater than the minimum amount of sunlight energy needed for solar cooling, otherwise repeating the step of comparing the available sunlight energy to the minimum amount of sunlight energy needed for solar cooling at a given time interval if the available sunlight energy is less than the minimum amount of sunlight energy needed for solar cooling.

8. The method of claim 5, wherein the cooling system further comprises a control unit having a memory and at least one processor device, coupled to the memory, the processor device operative to perform the step of comparing the ambient air temperature to the desired data center temperature and the step of selectively directing the water loop through the cooling tower or through a combination of the cooling tower and one or more of the modular refrigeration chiller units if the ambient air temperature is less than a desired data center temperature, otherwise repeating the step of comparing the ambient air temperature to the desired data center temperature at a given time interval if the ambient air temperature is greater than a desired data center temperature.

9. A data center cooling system comprising:
a solar cooling unit;
one or more modular refrigeration chiller units; and
a water loop that can be selectively directed through the solar cooling unit, through one or more of the modular refrigeration chiller units or through a combination thereof, wherein the water loop is configured, at an interface with the data center, to receive a heat load from the data center, and to deliver chilled water back to the interface with the data center;
a control unit configured to control direction of the water loop through the solar cooling unit, through one or more of the modular refrigeration chiller units or through a combination thereof;
a first water temperature sensor configured to measure water temperatures at a point in the water loop where the heat load from the data center is received; and
a second water temperature sensor configured to measure water temperatures at a point in the water loop where the chilled water is delivered back to the data center,
wherein both the first water temperature sensor and the second water temperature sensor are connected to, and monitored by, the control unit.

10. The cooling system of claim 9, further comprising a valve which under direction of the control unit is adapted to selectively direct at least a portion of the water loop through the solar cooling unit, through one or more of the modular refrigeration chiller units or through a combination thereof.

11. The cooling system of claim 9, further comprising a sunlight heat index sensor connected to, and monitored by, the control unit.

12. The cooling system of claim 9, further comprising a cooling tower through which the water loop can also be directed, wherein the water loop can be selectively directed through the solar cooling unit, through the cooling tower, through one or more of the modular refrigeration chiller units, through a combination of the solar cooling unit and one or more of the modular refrigeration chiller units or through a combination of the cooling tower and one or more of the modular refrigeration chiller units.

13. A method of cooling a data center, the method comprising the steps of:
providing a cooling system having a solar cooling unit, one or more modular refrigeration chiller units, and a water loop that can be selectively directed through the solar cooling unit, through one or more of the modular refrigeration chiller units or through a combination thereof, wherein the water loop is configured to, at an interface with the data center, receive a heat load from the data center, and to deliver chilled water back to the interface with the data center;
comparing available sunlight energy to a minimum amount of sunlight energy needed for solar cooling; and
selectively directing the water loop through the solar cooling unit or through a combination of the solar cooling unit and one or more of the modular refrigeration chiller units if the available sunlight energy is greater than the minimum amount of sunlight energy needed for solar cooling, otherwise repeating the step of comparing the available sunlight energy to the minimum amount of sunlight energy needed for solar cooling at a given time interval if the available sunlight energy is less than the minimum amount of sunlight energy needed for solar cooling.

14. The method of claim 13, further comprising the step of:
obtaining data on one or more of water temperatures in the water loop, water flow rate through the water loop, air flow rate through the cooling tower and available sunlight energy.

15. The method of claim 13, wherein the cooling system further comprises a cooling tower through which the water loop can also be directed, the method further comprising the steps of:
comparing an ambient air temperature to a desired data center temperature; and
selectively directing the water loop through the cooling tower or through a combination of the cooling tower and one or more of the modular refrigeration chiller units, if the ambient air temperature is less than a desired data center temperature, otherwise repeating the step of comparing the ambient air temperature to the desired data center temperature at a given time interval if the ambient air temperature is greater than a desired data center temperature.

16. The method of claim 13, wherein the cooling system further comprises a control unit having a memory and at least one processor device, coupled to the memory, the processor device operative to perform the step of comparing the available sunlight energy to the minimum amount of sunlight energy needed for solar cooling and the step of selectively directing the water loop through the solar cooling unit or through a combination of the solar cooling unit and one or more of the modular refrigeration chiller units if the available sunlight energy is greater than the minimum amount of sunlight energy needed for solar cooling, otherwise repeating the step of comparing the available sunlight energy to the minimum amount of sunlight energy needed for solar cooling at a given time interval if the available sunlight energy is less than the minimum amount of sunlight energy needed for solar cooling.

17. A method for optimizing location of a data center comprising the steps of:
   defining a particular region for locating the data center;
   sectioning the region into a plurality of climate zones;
   gathering one or more of temperature and sun irradiation data for a given one of the climate zones at a particular time interval frequency throughout the year;
   determining one or more of an amount of free cooling and an amount of solar cooling available for each of the time intervals associated with the given climate zone;
   determining a remaining amount of cooling needed above what can be provided by one or more of the free and the solar cooling for each of the time intervals associated with the given climate zone;
   determining the remaining amount of cooling needed above what can be provided by one or more of the free and the solar cooling for the given climate zone for one year; and
   comparing the remaining amount of cooling needed above what can be provided by one or more of the free and the solar cooling for each climate zone within the region to identify an optimum location for the data center.

18. The method of claim 17, wherein the step of determining one or more of an amount of free cooling and an amount of solar cooling available further comprises the step of:
   comparing ambient air temperatures and a desired data center temperature.

19. The method of claim 17, wherein the step of determining one or more of an amount of free cooling and an amount of solar cooling available further comprises the step of:
   comparing available sunlight energy to a minimum amount of sunlight energy needed for solar cooling.

20. The method of claim 17, wherein the optimum location for the data center comprises a given one of the climate zones within the region that has the lowest amount of cooling needed above what can be provided by one or more of the free and the solar cooling.

21. The method of claim 17, wherein the step of determining the remaining amount of cooling needed above what can be provided by one or more of the free and the solar cooling for the given climate zone for one year further comprises the step of:
   averaging the remaining amount of cooling needed above what can be provided by one or more of the free and the solar cooling throughout one year for the given climate zone.

22. The method of claim 17, further comprising the steps of:
   determining whether there are additional climate zones within the region; and
   repeating the steps of gathering one or more of temperature and sun irradiation data, determining one or more of an amount of free cooling and an amount of solar cooling available, determining a remaining amount of cooling needed above what can be provided by one or more of the free and the solar cooling, determining the remaining amount of cooling needed above what can be provided by one or more of the free and the solar cooling for one year, comparing the remaining amount of cooling needed above what can be provided by one or more of the free and the solar cooling for each climate zone within the region to identify an optimum location for the data center and determining whether there are additional climate zones within the region.

23. An article of manufacture for optimizing location of a data center, comprising a machine-readable medium containing one or more programs which when executed implement the steps of the method according to claim 17.

* * * * *